United States Patent
Akagi et al.

(10) Patent No.: US 7,846,998 B2
(45) Date of Patent: Dec. 7, 2010

(54) SEALANT EPOXY-RESIN MOLDING MATERIAL, AND ELECTRONIC COMPONENT DEVICE

(75) Inventors: Seiichi Akagi, Chikusei (JP); Mitsuo Katayose, Tsukuba (JP); Takatoshi Ikeuchi, Los catos, CA (US); Yoshinori Endou, Chikusei (JP); Ryouichi Ikezawa, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 129 days.

(21) Appl. No.: 10/598,515

(22) PCT Filed: Mar. 3, 2005

(86) PCT No.: PCT/JP2005/003592

§ 371 (c)(1),
(2), (4) Date: Sep. 1, 2006

(87) PCT Pub. No.: WO2005/085316

PCT Pub. Date: Sep. 15, 2005

(65) Prior Publication Data

US 2008/0234409 A1    Sep. 25, 2008

(30) Foreign Application Priority Data

Mar. 3, 2004    (JP)    .............................. 2004-059106

(51) Int. Cl.
  C03C 25/26    (2006.01)
  C08G 59/38    (2006.01)
  C08K 5/00    (2006.01)
(52) U.S. Cl. ........................ 523/427; 523/203; 523/404; 523/466; 524/304; 524/308
(58) Field of Classification Search ................ 257/793, 257/787, 789, 792; 525/476, 477, 481, 533; 427/387; 523/457, 466, 203, 404, 427; 528/14, 528/34, 37, 97; 106/287.12; 156/329; 524/304, 524/308
See application file for complete search history.

(56) References Cited

U.S. PATENT DOCUMENTS

| | | | | |
|---|---|---|---|---|
| 5,962,139 | A * | 10/1999 | Hagiwara et al. | 428/413 |
| 6,040,395 | A * | 3/2000 | Isshiki et al. | 525/476 |
| 7,307,128 | B2 * | 12/2007 | Hayakawa et al. | 525/481 |
| 2003/0201548 | A1 * | 10/2003 | Ikezawa et al. | 257/793 |
| 2008/0039556 | A1 * | 2/2008 | Ikezawa et al. | 523/451 |
| 2009/0062430 | A1 * | 3/2009 | Ikezawa et al. | 523/400 |
| 2009/0137717 | A1 * | 5/2009 | Ikezawa et al. | 524/431 |
| 2009/0143511 | A1 * | 6/2009 | Ikezawa et al. | 524/127 |

FOREIGN PATENT DOCUMENTS

| | | |
|---|---|---|
| CN | 1636987 | 7/2005 |
| JP | 54-122263 A | 9/1979 |
| JP | 03-115424 | 5/1991 |
| JP | 05-283560 | 10/1993 |
| JP | 05283560 A * | 10/1993 |
| JP | 06-107758 | 4/1994 |
| JP | 06-128362 | 5/1994 |
| JP | 07-082343 | 3/1995 |
| JP | 08-225714 | 9/1996 |
| JP | 09-100337 | 4/1997 |
| JP | 09-216933 | 8/1997 |
| JP | 09-227765 | 9/1997 |
| JP | 09-235449 | 9/1997 |
| JP | 09-241483 | 9/1997 |
| JP | 10-114815 | 5/1998 |
| JP | 10-310629 | 11/1998 |
| JP | 11-140277 | 5/1999 |
| JP | 11-158353 | 6/1999 |
| JP | 11-269349 | 10/1999 |
| JP | 2002-363251 | 12/2002 |

(Continued)

OTHER PUBLICATIONS

STIC search.*

(Continued)

Primary Examiner—Vasu Jagannathan
Assistant Examiner—Hannah Pak
(74) Attorney, Agent, or Firm—Griffin & Szipl, P.C.

(57) ABSTRACT

Disclosed is an encapsulation epoxy resin material containing an epoxy resin (A) and a curing agent (B). The epoxy resin (A) contains a compound represented by the general formula (I) below. The encapsulation epoxy resin material has excellent reliability in flame retardance, formability, reflow resistance, moisture resistance, high-temperature shelf characteristics and the like, and is suitably used for encapsulation of a VLSI. Also disclosed is an electronic component comprising an element encapsulated with such a material. (I) (In the general formula (I), $R^1$s may be the same or different and respectively represent one selected from substituted or unsubstituted hydrocarbon groups having 1-12 carbon atoms and substituted or unsubstituted alkoxy groups having 1-12 carbon atoms; n represents an integer of 0-4; $R^2$s may be the same or different and respectively represent one selected from substituted or unsubstituted hydrocarbon groups having 1-12 carbon atoms and substituted or unsubstituted alkoxy groups having 1-12 carbon atoms; and m represents an integer of 0-6.)

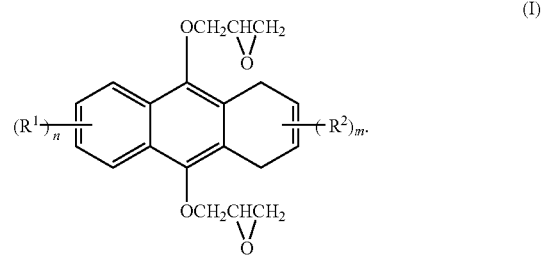

(I)

26 Claims, No Drawings

FOREIGN PATENT DOCUMENTS

| | | |
|---|---|---|
| JP | 2003-064242 | 3/2003 |
| JP | 2003-192876 | 7/2003 |
| JP | 2003-321532 | 11/2003 |
| JP | 2003-327791 | 11/2003 |
| JP | 2005-015559 | 1/2005 |
| JP | 2005-97473 A | 4/2005 |
| JP | 2005-113084 A | 4/2005 |

OTHER PUBLICATIONS

Office Action Issued in the Corresponding Chinese Application No. 2005800043985 on Apr. 18, 2008.

Kato, Hiroshi, Material Report R&D, "Toward Safer Flame Proofing Technology for Polymers," Function Materials Monthly, vol. 11, No. 6, 1991, pp. 34-41, with full English translation.

Periodic Table, Dictionary of Chemistry 4, 30th Edition, published by Kyoritsu Shuppan Co., Ltd., Feb. 15, 1987, with full English translation.

International Search Report issued in corresponding application No. PCT/JP2005/003592, completed May 20, 2005 and mailed Jun. 7, 2005.

PCT/ISA/237 International Preliminary Report on Patentability in corresponding application No. PCT/JP2005/003592, dated Jun. 7, 2005.

English Machine Translation of the Nakamura Document JP05-283560, downloaded from the Japanese Patent Office Database, Aug. 5, 2008, pp. 1-26. Exhibit A.

Hawley's Condensed Chemical Dictionary (1987), p. 85, Exhibit A2.

The contents of STN Easy, dated Nov. 11, 2003, Exhibit B.

STN Tokyo database search results, pp. 1-3, Exhibit C.

Office Action issued in counterpart Japanese Application No. 2006-51075, dated Apr. 27, 2010.

Office Action issued in corresponding Japanese Application No. 2006-510715, completed Aug. 16, 2010, mailed Aug. 24, 2010.

English Translation of Japanese Office Action in corresponding Japanese Application No. 2006-510715, completed Aug. 16, 2010, mailed Aug. 24, 2010.

* cited by examiner

SEALANT EPOXY-RESIN MOLDING MATERIAL, AND ELECTRONIC COMPONENT DEVICE

This is a National Phase Application in the United States of International Patent Application No. PCT/JP2005/003592 filed Mar. 3, 2005, which claims priority on Japanese Patent Application No. 2004-059106, filed Mar. 3, 2004. The entire disclosures of the above patent applications are hereby incorporated by reference.

TECHNICAL FIELD

The present invention relates to a sealant epoxy-resin molding material and an electronic component device sealed with the molding material.

BACKGROUND ART

Resin sealing has been mainly used in the field of element sealing of electronic component devices such as transistor and IC from the points of productivity, cost, and other, and epoxy resin molding materials have been used widely. It is because epoxy resins are well balanced in electrical properties, moisture resistance, heat resistance, mechanical properties, adhesiveness to insert materials, and others. These sealant epoxy-resin molding materials are flame proofed mainly with a combination of antimony oxide and a brominated resin such as tetrabromobisphenol A diglycidyl ether.

In the recent move for regulation of halogenated resins including decabrom and antimony compounds for environmental protection after concern about the dioxins problem, there exist an increasing need for non-nonhalogenated (non-brominated) and non-antimony sealant epoxy-resin molding materials. In addition, bromine compounds are known to show an adverse effect on the high-temperature storage stability of plastic-sealed IC's. It is desirable to reduce the amount of brominated resin also from the viewpoint.

There are many proposed flame-proofing methods without use of a brominated resin and an antimony oxide, including the methods of using a flame retardant containing no halogen or antimony, for example, red phosphorus (see, e.g., Patent Document 1), a phosphoric ester compound (see e.g., Patent Document 2), a phosphazene compound (see, e.g., Patent Document 3), a metal hydroxide (see e.g., Patent Document 4), a metal hydroxide and a metal oxide in combination (see, e.g., Patent Document 5), a cyclopentadienyl compound such as ferrocene (see, e.g., Patent Document 6), or an organic metal compound such as copper acetylacetonate (see, e.g., Nonpatent Document 1); methods of increasing the content of filler (see, e.g., Patent Document 7); and recently, methods of using a high flame-retardancy resin (see, e.g., Patent Document 8); and the like.

Patent Document 1: Japanese Patent Application Laid-Open No. 9-227765
Patent Document 2: Japanese Patent Application Laid-Open No. 9-235449
Patent Document 3: Japanese Patent Application Laid-Open No. 8-225714
Patent Document 4: Japanese Patent Application Laid-Open No. 9-241483
Patent Document 5: Japanese Patent Application Laid-Open No. 9-100337
Patent Document 6: Japanese Patent Application Laid-Open No. 11-269349
Nonpatent Document 1: Hiroshi Kato, Function Materials Monthly (CMC Publishing Co., Ltd.), 11(6), 34 (1991).
Patent Document 7: Japanese Patent Application Laid-Open No. 7-82343
Patent Document 8: Japanese Patent Application Laid-Open No. 11-140277

SUMMARY OF THE INVENTION

Problems to be Solved by the Invention

However, there is a problem of deterioration in moisture resistance when red phosphorus is used as the sealant epoxy-resin molding material, problems of deterioration in moldability by plasticization and in moisture resistance when a phosphoric ester or phosphazene compound is used, problems of deterioration in flow ability and mold release characteristics when a metal hydroxide is used, or a problem of deterioration in flowability when a metal oxide is used or when the filler content is raised. In addition, there is a problem of inhibition of curing reaction and thus, deterioration in moldability when an organic metal compound such as copper acetylacetonate is used. Further, in the method of using a high flame-retardancy resin, the electronic component devices obtained could not satisfy the requirement in flame resistance specified by UL-94 V-0 sufficiently.

As described above, any of the non-halogen, non-antimony flame retardant, the methods of raising the content of filler and of using a high flame-retardancy resin was not possible to obtain moldability, reliability and flame resistance the same as those of the sealant epoxy-resin molding materials using a brominated resin and antimony oxide in combination.

An object of the present invention, which was made under the circumstances above, is to provide a nonhalogenated and non-antimony sealant epoxy-resin molding material superior in flame resistance and still retaining reliability, for example, of moldability, reflow resistance, moisture resistance and high-temperature storage, and an electronic component device containing elements sealed with the same.

Means to Solve the Problems

After intensive studies to solve the problems above, the present inventors have found that it was possible to achieve the object by using a sealant epoxy-resin molding material containing a particular epoxy resin, and completed the present invention.

The present invention relates to the following inventions.

(1) A sealant epoxy-resin molding material, comprising an epoxy resin (A) and a hardening agent (B), wherein the epoxy resin (A) contains a compound represented by the following General Formula (I):

[Formula 1]

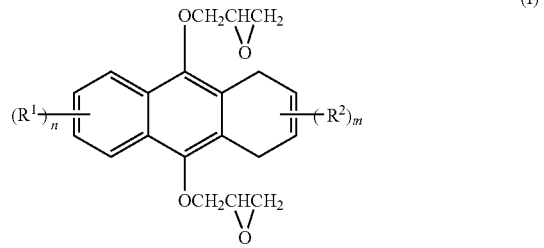

(in General Formula (I), $R^1$ represents a group selected from substituted or unsubstituted hydrocarbon groups having 1 to 12 carbon atoms and substituted or unsubstituted alkoxyl groups having 1 to 12 carbon atoms; and the groups R¹ may be the same as or different from each other; n is an integer of 0 to 4; R² represents a group selected from substituted or unsubstituted hydrocarbon groups having 1 to 12 carbon atoms and substituted or unsubstituted alkoxy groups having 1 to 12 carbon atoms and the groups R² may be the same as or different from each other; and m is an integer of 0 to 6).

(2) The sealant epoxy-resin molding material described in (1), wherein the hardening agent (B) contains a compound represented by the following General Formula (II):

[Formula 2]

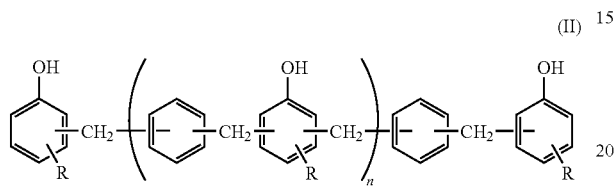

(II)

(wherein, R represents a group selected from a hydrogen atom and substituted or unsubstituted monovalent hydrocarbon groups having 1 to 10 carbon atoms, and n is an integer of 0 to 10).

(3) The sealant epoxy-resin molding material described in (1) or (2), further comprising a hardening accelerator (C).

(4) The sealant epoxy-resin molding material described in (3), wherein the hardening accelerator (C) is triphenylphosphine.

(5) The sealant epoxy-resin molding material described in (3), wherein the hardening accelerator (C) is an adduct of a tertiary phosphine compound and a quinone compound.

(6) The sealant epoxy-resin molding material described in anyone of (1) to (5), further comprising an inorganic filler (D).

(7) The sealant epoxy-resin molding material described in (6), wherein the content of the inorganic filler (D) is 60 to 95 wt % with respect to the sealant epoxy-resin molding material.

(8) The sealant epoxy-resin molding material described in (6) or (7), wherein the content of the inorganic filler (D) is 70 to 90 wt % with respect to the sealant epoxy-resin molding material.

(9) The sealant epoxy-resin molding material described in any one of (1) to (8), further comprising a coupling agent (E).

(10) The sealant epoxy-resin molding material described in (9), wherein the coupling agent (E) contains a secondary amino group-containing silane-coupling agent.

(11) The sealant epoxy-resin molding material described in (10), wherein the secondary amino group-containing silane-coupling agent contains a compound represented by the following General Formula (III):

[Formula 3]

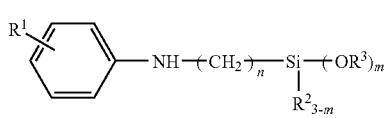

(III)

(wherein, R¹ represents a group selected from a hydrogen atom, alkyl groups having 1 to 6 carbon atoms, and alkoxy group having 1 to 2 carbon atoms; R² represents a group selected from alkyl groups having 1 to 6 carbon atoms and a phenyl group; R³ represents a methyl or ethyl group; n is an integer of 1 to 6; and m is an integer of 1 to 3).

(12) The sealant epoxy-resin molding material described in anyone of (1) to (11), wherein the epoxy resin (A) and the hardening agent (B) are melt-mixed previously.

(13) The sealant epoxy-resin molding material described in any one of (1) to (12), further comprising a silicon-containing polymer (F) having the following bonds (c) and (d), a terminal selected from R¹, a hydroxyl group and alkoxy groups, and an epoxy equivalence of 500 to 4,000.

[Formula 4]

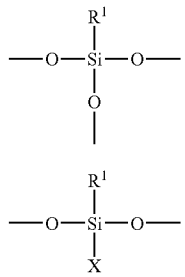

(wherein, R¹ represents a group selected from substituted or unsubstituted monovalent hydrocarbon groups having 1 to 12 carbon atoms and the groups R¹ in the silicon-containing polymer may be the same as or different from each other. X represents an epoxy group-containing monovalent organic group).

(14) The sealant epoxy-resin molding material described in (13), wherein the silicon-containing polymer (F) has the following bond (e) additionally:

[Formula 5]

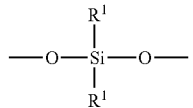

(e)

(wherein, R¹ represents a group selected from substituted or unsubstituted monovalent hydrocarbon groups having 1 to 12 carbon atoms; and the groups R¹ in the silicon-containing polymer may be the same as or different from each other).

(15) The sealant epoxy-resin molding material described in any one of (13) to (14), wherein the softening temperature of the silicon-containing polymer (F) is 40° C. or higher and 120° C. or lower.

(16) The sealant epoxy-resin molding material described in anyone of (13) to (15), wherein R¹ in the silicon-containing polymer (F) represents at least one of a substituted or unsubstituted phenyl group and a substituted or unsubstituted methyl group.

(17) The sealant epoxy-resin molding material described in any one of (13) to (16), wherein the rate of substituted or unsubstituted phenyl groups having 1 to 12 carbon atoms in all groups R in the silicon-containing polymer (F) is 60 to 100 mol %.

(18) The sealant epoxy-resin molding material described in anyone of (1) to (17), further comprising at least one of a compound (G) represented by Compositional Formula (XXXXIX) and a compound (H) represented by the following Compositional Formula (XXXXXIX):

(Formula 6)

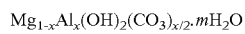  (XXXXIX)

($0 < X \leq 0.5$; and m is a positive number), and (Formula 7)

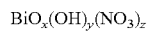  (XXXXXIX)

($0.9 \leq x \leq 1.1$; $0.6 \leq y \leq 0.8$; and $0.2 \leq z \leq 0.4$).

(19) An electronic component device, comprising an element sealed with the sealant epoxy-resin molding material described in any one of (1) to (18).

EFFECT OF THE INVENTION

The sealant epoxy-resin molding material according to the present invention gives electronic component devices and other products superior in flame resistance and is of significant value industrially.

BEST MODE OF CARRYING OUT THE INVENTION

The epoxy resin (A) according to the present invention is characterized by containing a compound represented by the following General Formula (I).

[Formula 8]

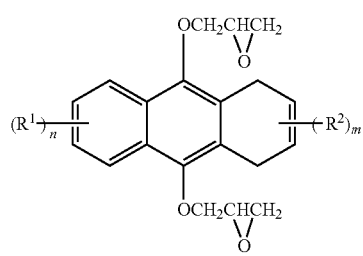

(I)

(in General Formula (I), $R^1$ represents a group selected from substituted or unsubstituted hydrocarbon groups having 1 to 12 carbon atoms and substituted or unsubstituted alkoxyl groups having 1 to 12 carbon atoms and the groups $R^1$ may be the same or different from each other; n is an integer of 0 to 4: $R^2$ represents a group selected from substituted or unsubstituted hydrocarbon groups having 1 to 12 carbon atoms and substituted or unsubstituted alkoxy groups having 1 to 12 carbon atoms and the groups $R^2$ may be the same as or different from each other; and m is an integer of 0 to 6).

Examples of the epoxy resins represented by the Formula (I) include the epoxy resins from the monomer represented by the following Formula (IV) to (XXII), and the like.

[Formula 9]

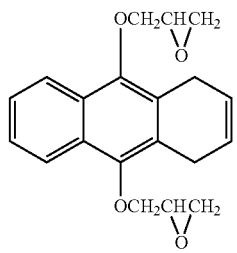 (IV)

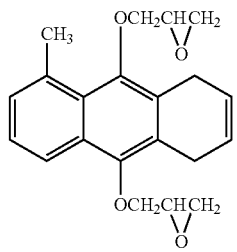 (V)

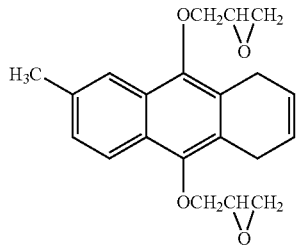 (VI)

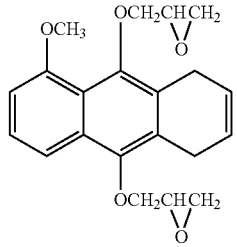 (VII)

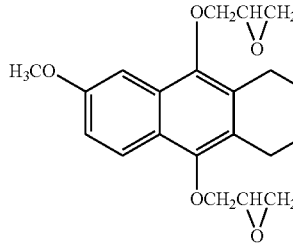 (VIII)

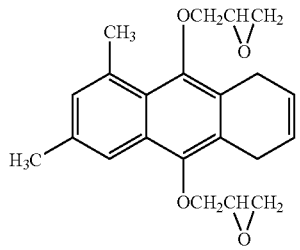 (IX)

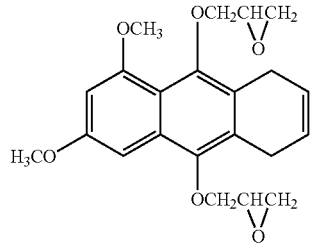
(X)
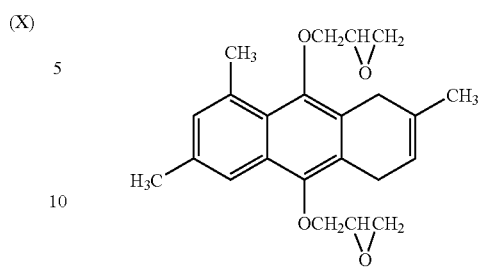
(XV)
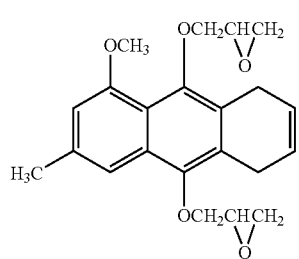
(XI)
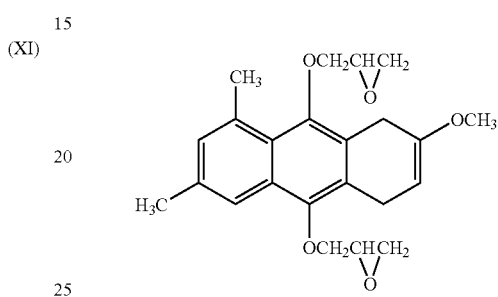
(XVI)
[Formula 10]
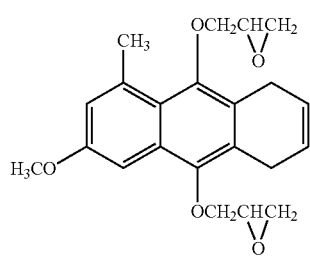
(XII)
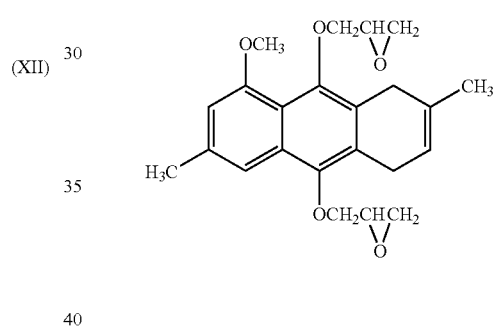
(XVII)
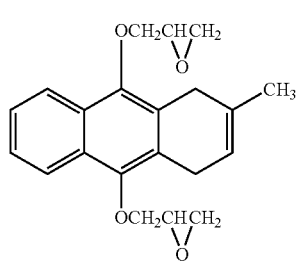
(XIII)
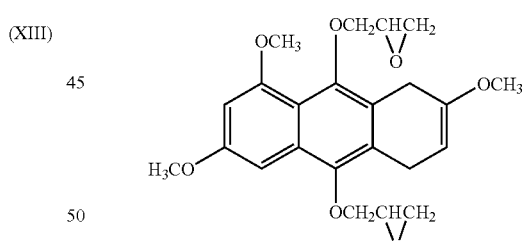
(XVIII)
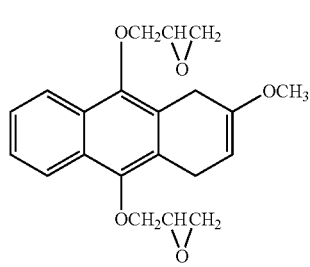
(XIV)
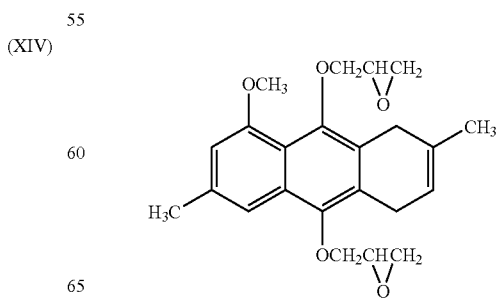
(XIX)

[Formula 11]

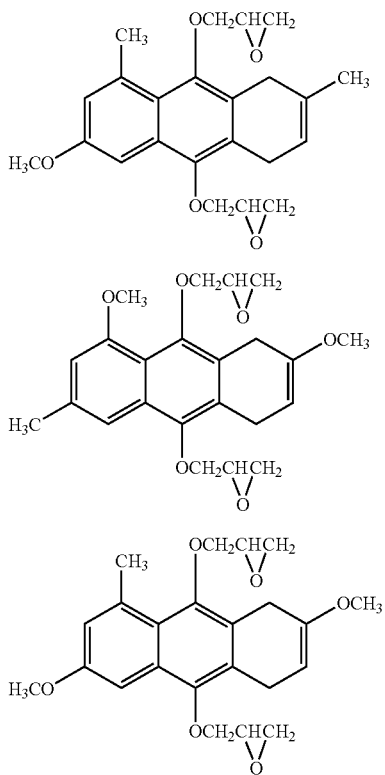

Among the resins, the epoxy resins from the monomer represented by Formula (IV) are preferable, from the viewpoints of flame resistance and moldability. Commercially available products of such resins include YL-7172 (trade name, manufactured by Japan Epoxy Resin Co., Ltd.) and the like.

The blending rate of the epoxy resin represented by the General Formula (I) is preferably 30 wt % or more, more preferably 50 wt % or more, and still more preferably 60 wt % or more, with respect to the total amount of the epoxy resin, for making the resin show its favorable properties.

The sealant epoxy-resin molding material according to the present invention may contain another known epoxy resin as needed. Examples of the epoxy resins for use include epoxidized novolak resins prepared from a novolak resin obtained by condensation or cocondensation of a phenol such as phenol, cresol, xylenol, resorcin, catechol, bisphenol A, or bisphenol F, and/or a naphthol such as α-naphthol, β-naphthol, or dihydroxynaphthalene, with an aldehyde group-containing compound such as formaldehyde, acetaldehyde, propionaldehyde, benzaldehyde, or salicylic aldehyde in the presence of an acidic catalyst, including phenolic novolak epoxy resins, ortho-cresol novolak epoxy resins, and triphenylmethane skeleton-containing epoxy resins; diglycidyl ethers of bisphenol A, bisphenol F, bisphenol S, and alkyl-substituted or unsubstituted bisphenols, and the like; stilbene-based epoxy resins; hydroquinone-based epoxy resins; glycidyl ester-based epoxy resins obtained in reaction of epichlorohydrin and a polybasic acid such as phthalic acid or dimer acid; glycidylamine-based epoxy resins obtained in reaction of epichlorohydrin and a polyamine such as diaminodiphenylmethane or isocyanuric acid; epoxides of cocondensation resins of dicyclopentadiene and a phenol; naphthalene ring-containing epoxy resins; epoxides of aralkyl-based phenol resins such as xylylene or biphenylene skeleton-containing phenol-aralkyl resin and naphthol-aralkyl resin; trimethylolpropane-based epoxy resins; terpene-modified epoxy resins; linear aliphatic epoxy resins obtained by oxidizing olefin bonds with a peracid such as peracetic acid; alicyclic epoxy resins; sulfur atom-containing epoxy resins; and the like, and these resins may be used alone or in combination of two or more.

Among them, biphenyl-based, bisphenol F-based, stilbene-based and sulfur atom-containing epoxy resins are preferable from the viewpoints of flowability and reflow resistance; novolak epoxy resins are preferable from the viewpoint of hardening efficiency; dicyclopentadiene-based epoxy resins are preferable from the viewpoint of low hygroscopicity; naphthalene-based and triphenylmethane-based epoxy resins are preferable from the viewpoints of heat resistance and warpage resistance; and biphenylene-based and naphthol-aralkyl-based epoxy resins are preferable from the viewpoint of flame resistance. The sealant epoxy-resin molding material according to the present invention preferably contains at least one of these epoxy resins additionally.

Examples of the biphenyl-based epoxy resins include the epoxy resins represented by the following General Formula (XXIII) and the like; examples of the bisphenol F-based epoxy resins include the epoxy resins represented by the following General Formula (XXIV) and the like; examples of the stilbene-based epoxy resins include the epoxy resins represented by the following General Formula (XXV) and the like; and examples of the sulfur atom-containing epoxy resins include the epoxy resins represented by the following General Formula (XXVI) and the like.

[Formula 12]

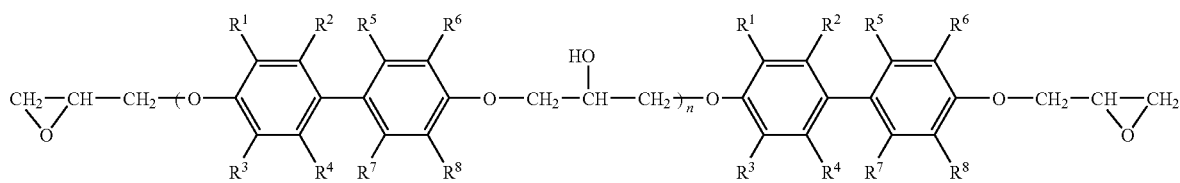

(wherein, $R^1$ to $R^8$ each represent a group selected from a hydrogen atom and substituted or unsubstituted monovalent hydrocarbon groups having 1 to 10 carbon atoms and may be the same or different from each other; and n is an integer of 0 to 3).

[Formula 13]

(XXIV)

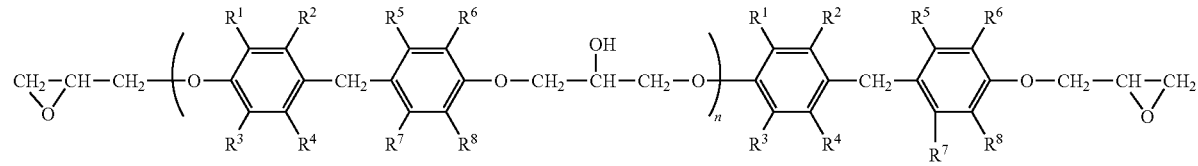

(wherein, $R^1$ to $R^8$ each represent a group selected from a hydrogen atom, alkyl group having 1 to 10 carbon atoms, alkoxyl groups having 1 to 10 carbon atoms, aryl groups having 6 to 10 carbon atoms, and aralkyl groups having 6 to 10 carbon atoms and may be the same or different from each other; and n is an integer of 0 to 3).

products thereof include YX-4000 (trade name, manufactured by Japan Epoxy Resin Co., Ltd.) and the like.

For example, resins containing the bisphenol F-based epoxy resin represented by General Formula (XXIV), wherein $R^1$, $R^3$, $R^6$ and $R^8$ are methyl groups, $R^2$, $R^4$, $R^5$ and $R^7$ are hydrogen atoms, and n=0, as the principal component,

[Formula 14]

(XXV)

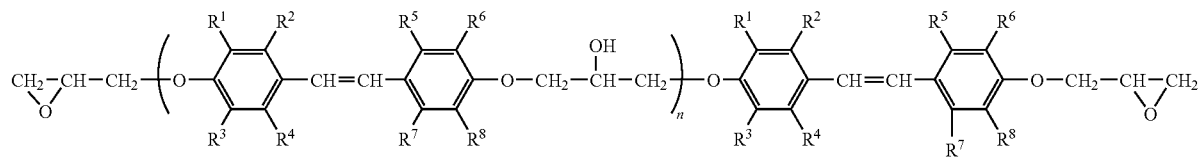

(wherein, $R^1$ to $R^8$ each represent a group selected from a hydrogen atom and substituted or unsubstituted monovalent hydrocarbon groups having 1 to 5 carbon atoms and may be the same or different from each other; and n is an integer of 0 to 10).

such as YSLV-80XY (trade name, manufactured by Tohto Kasei Co., Ltd.), are available on the market.

Stilbene-based epoxy resin represented by General Formula (XXV) can be prepared in reaction of a raw material

[Formula 15]

(XXVI)

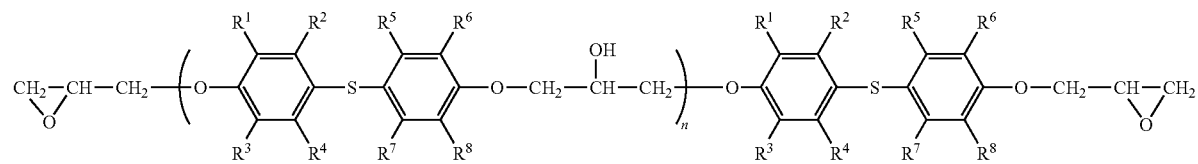

(wherein, $R^1$ to $R^8$ each represent a group selected from a hydrogen atom, substituted or unsubstituted alkyl groups having 1 to 10 carbon atoms, and substituted or unsubstituted alkoxy groups having 1 to 10 carbon atoms and may be the same or different from each other; and n is an integer of 0 to 3).

Examples of the biphenyl-based epoxy resins represented by General Formula (XXIII) include epoxy resins containing 4,4'-bis(2,3-epoxypropoxy) biphenyl or 4,4'-bis(2,3-epoxypropoxy)-3,3',5,5'-tetramethylbiphenyl as the principal component; epoxy resins prepared in reaction of epichlorohydrin and 4,4'-biphenol or 4,4'-(3,3',5,5'-tetramethyl)biphenol; and the like. Among them, epoxy resins containing 4,4'-bis(2,3-epoxypropoxy)-3,3',5,5'-tetramethylbiphenyl as the principal component are preferable. Commercially available stilbene-based phenol and epichlorohydrin in the presence of a basic substance. Examples of the raw stilbene-based phenols include
3-tert-butyl-4,4'-dihydroxy-3',5,5'-trimethylstilbene,
3-tert-butyl-4,4'-dihydroxy-3',5',6-trimethylstilbene,
4,4'-dihydroxy-3,3',5,5'-tetramethylstilbene,
4,4'-dihydroxy-3,3'-di-tert-butyl-5,5'-dimethylstilbene,
4,4'-dihydroxy-3,3'-di-tert-butyl-6,6'-dimethylstilbene, and the like; and, among them,
3-tert-butyl-4,4'-dihydroxy-3',5,5'-trimethylstilbene and 4,4'-dihydroxy-3,3',5,5'-tetramethylstilbene are preferable. These stilbene-based phenols may be used alone or in combination of two or more.

Among the sulfur atom-containing epoxy resins represented by General Formula (XXVI), epoxy resins in which $R^2$, $R^3$, $R^6$ and $R^7$ are hydrogen atoms and $R^1$, $R^4$, $R^5$ and $R^8$ are alkyl groups are preferable; and epoxy resins in which $R^2$, $R^3$, $R^6$ and $R^7$ are hydrogen atoms, $R^1$ and $R^8$ are tert-butyl groups, and $R^4$ and $R^5$ are methyl groups are more preferable. Commercially available products of such compounds include YSLV-120TE (trade name, manufactured by Tohto Kasei Co., Ltd.) and the like.

These epoxy resins may be used alone or in combination of two or more.

Examples of the novolak epoxy resins include the epoxy resins represented by the following General Formula (XXVII) and the like.

[Formula 16]

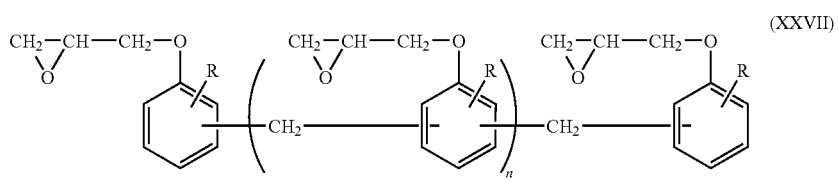

(XXVII)

(wherein, R is a group selected from a hydrogen atom and substituted or unsubstituted monovalent hydrocarbon groups having 1 to 10 carbon atoms; and n is an integer of 0 to 10).

The novolak epoxy resin represented by General Formula (XXVII) can be prepared easily in reaction of a novolak phenol resin with epichlorohydrin. R in General Formula (XXVII) is preferably an alkyl group having 1 to 10 carbon atoms such as methyl, ethyl, propyl, butyl, isopropyl, or isobutyl, or an alkoxyl group having 1 to 10 carbon atoms such as methoxy, ethoxy, propoxy, or butoxy, and more preferably a hydrogen atom or a methyl group. n is preferably an integer of 0 to 3. o-Cresol novolak epoxy resins are preferable among the novolak epoxy resins represented by General Formula (XXVII). Commercially available products of such compounds include ESCN-190 (trade name, manufactured by Sumitomo Chemical Co., Ltd.) and the like.

Examples of the dicyclopentadiene-based epoxy resins include the epoxy resins represented by the following General Formula (XXVIII) and the like.

(wherein, $R^1$ and $R^2$ each independently represent a group selected from a hydrogen atom and substituted or unsubstituted monovalent hydrocarbon group having 1 to 10 carbon atoms; n is an integer of 0 to 10; and m is an integer of 0 to 6).

Examples of the group $R^1$ in Formula (XXVIII) include a hydrogen atom; alkyl groups such as methyl, ethyl, propyl, butyl, isopropyl, and tert-butyl; alkenyl groups such as vinyl, allyl, and butenyl; and substituted or unsubstituted monovalent hydrocarbon group having 1 to 5 carbon atoms such as alkyl halide groups, amino group-substituted alkyl groups, and mercapto group-substituted alkyl groups; among them, alkyl groups such as methyl and ethyl and a hydrogen atom are preferable; and a methyl group and a hydrogen atom are more preferable. Examples of the group $R^2$ include a hydrogen atom; alkyl groups such as methyl, ethyl, propyl, butyl, isopropyl, and tert-butyl; alkenyl groups such as vinyl, allyl, and butenyl; and substituted or unsubstituted monovalent hydrocarbon group having 1 to 5 carbon atoms such as alkyl halide groups, amino group-substituted alkyl groups, and mercapto group-substituted alkyl groups; and among them, a hydrogen atom is preferable. Commercially available products of such compounds include HP-7200 (trade name, manufactured by Dainippon Ink and Chemicals, Inc.) and the like.

Examples of the naphthalene-based epoxy resins include the epoxy resins represented by the following General Formula (XXIX) and the like; and examples of the triphenylmethane-based epoxy resins include those represented by the following General Formula (XXX) and the like.

[Formula 17]

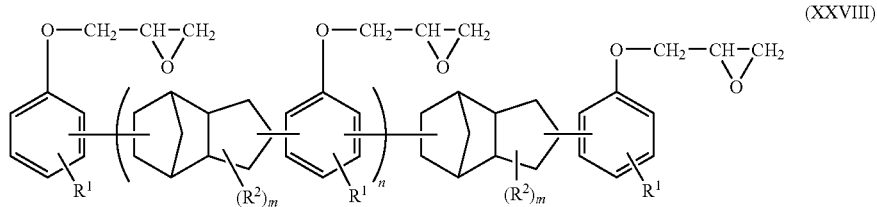

(XXVIII)

[Formula 18]

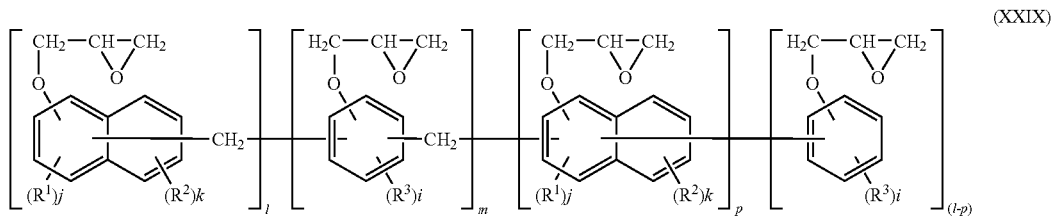

(wherein, $R^1$ to $R^3$ each represent a group selected from a hydrogen atom and substituted or unsubstituted monovalent hydrocarbon group having 1 to 12 carbon atoms and may be the same or different from each other; p is 1 or 0; and each of l and m is an integer of 0 to 11 satisfying the conditions that (l+m) is an integer of 1 to 11 and (l+p) is an integer of 1 to 12; i is an integer of 0 to 3; j is an integer of 0 to 2; and k is an integer of 0 to 4).

Examples of the naphthalene-based epoxy resins represented by General Formula (XXIX) include random copolymers containing l constituent unist and m other constituent units randomly, alternating copolymers containing them alternately, ordered copolymers containing them orderly, and block copolymers containing them blockwise; and these resins may be use alone or in combination of two or more. The compounds in which $R^1$ and $R^2$ are hydrogen atom and $R^3$ is a methyl group are available on the market as NC-7000 (trade name, manufactured by Nippon Kayaku Co., Ltd.) and others.

[Formula 19]

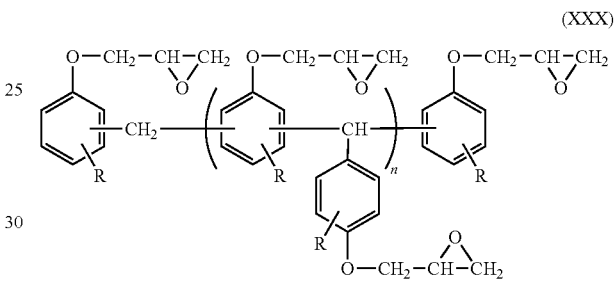

(wherein, R is a group selected from a hydrogen atom and substituted or unsubstituted monovalent hydrocarbon groups having 1 to 10 carbon atoms; and n is an integer of 1 to 10).

Compounds in which R is a hydrogen atom are available on the market as E-1032 (trade name, manufactured by Japan Epoxy Resin Co., Ltd.) and others.

Examples of the biphenylene-based epoxy resins include the epoxy resins represented by the following General Formula (XXXXX) and the like; and examples of the naphthol-aralkyl-based epoxy resins include the epoxy resins represented by the following General Formula (XXXXXI) and the like.

[Formula 20]

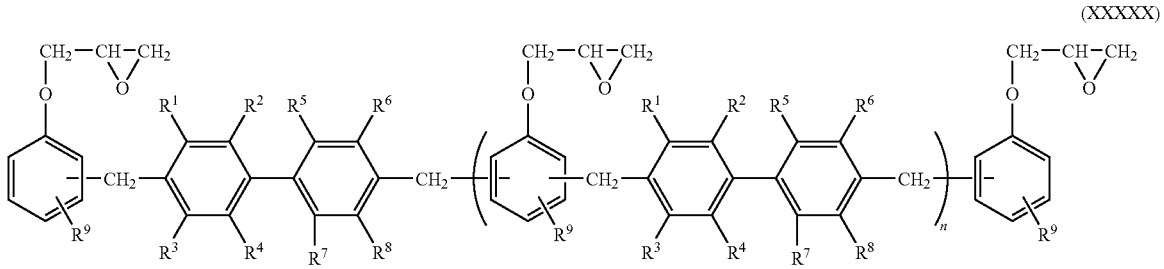

(wherein, $R^1$ to $R^9$ each independently represent a group selected from a hydrogen atom; alkyl groups having 1 to 10 carbon atoms such as methyl, ethyl, propyl, butyl, isopropyl, and isobutyl; alkoxyl groups having 1 to 10 carbon atoms such as methoxy, ethoxy, propoxy, and butoxy; aryl group having 6 to 10 carbon atoms such as phenyl, toluyl, and xylyl; and, aralkyl group having 6 to 10 carbon atoms such as benzyl and phenethyl; among them, a hydrogen atom and a methyl group are preferable; and n is an integer of 0 to 10).

pound such as formaldehyde, benzaldehyde, or salicylic aldehyde in the presence of an acidic catalyst; aralkyl-based phenol resins prepared form phenols and/or naphthols and dimethoxy-p-xylene or bis(methoxymethyl)biphenyl, such as phenol-aralkyl resins, biphenylene-based phenol-aralkyl resins, and naphthol-aralkyl resin; dicyclopentadiene-based phenol resin prepared in copolymerization of phenols and/or naphthols and dicyclopentadiene, such as dicyclopentadiene-based phenolic novolak resins and dicyclopentadiene-based

[Formula 21]

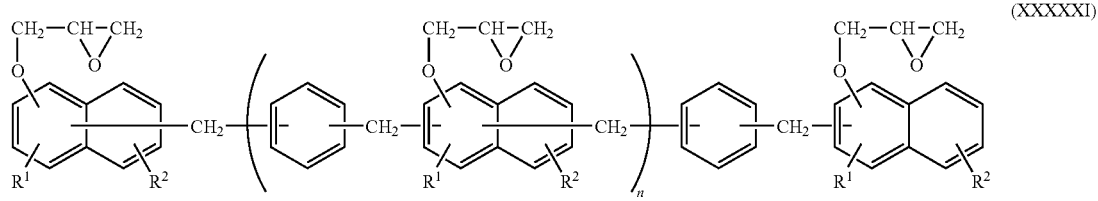

(wherein, $R^1$ to $R^3$ each represent a group selected from a hydrogen atom and substituted or unsubstituted monovalent hydrocarbon group having 1 to 12 carbon atoms, and may be the same or different from each other; and n is an integer of 1 to 10).

Commercially available products of the biphenylene-based epoxy resins include NC-3000 (trade name, manufactured by Nippon Kayaku Co., Ltd.). Commercially available products of the naphthol-aralkyl-based epoxy resins include naphthol novolak resins; triphenylmethane-based phenol resins; terpene-modified phenol resins; para-xylylene and/or meta-xylylene-modified phenol resins; melamine-modified phenol resins; cyclopentadiene-modified phenol resins; phenol resins prepared by copolymerization of two or more of the resins above; and the like. These resins may be use alone or in combination of two or more.

Among them, the phenol-aralkyl resins represented by the following General Formula (II) are preferable from the viewpoints of flame resistance and moldability.

[Formula 22]

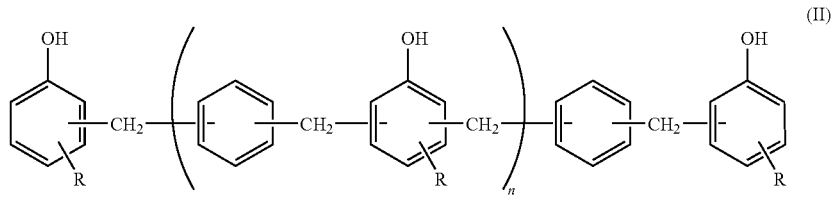

ESN-175 (trade name, manufactured by Tohto Kasei Co., Ltd.) and others.

These epoxy resins may be used alone or in combination of both of them.

The hardening agent (B) for use in the present invention is not particularly limited, if it is commonly used in sealant epoxy-resin molding materials. Examples thereof include novolak phenol resins prepared in condensation or cocondensation of a phenol such as phenol, cresol, resorcin, catechol, bisphenol A, bisphenol F, phenylphenol, or aminophenol, and/or a naphthol such as α-naphthol, β-naphthol, or dihydroxynaphthalene, with an aldehyde group-containing com- (wherein, R is a group selected from a hydrogen atom and substituted or unsubstituted monovalent hydrocarbon groups having 1 to 10 carbon atoms; and n is an integer of 0 to 10).

Phenol-aralkyl resins in which R in General Formula (II) is a hydrogen atom and the average of n is 0 to 8 are more preferable. Typical examples thereof include p-xylylene-based phenol-aralkyl resins, m-xylylene-based phenol-aralkyl resins, and the like. Commercially available products of such compounds include XLC (trade name, manufactured by Mitsui Chemicals, Inc.) and others. When one of these aralkyl-based phenol resins is used, the blending amount thereof is preferably 30 wt % or more, more preferably 50 wt % or more, with respect to the total amount of the hardening agents, for making the resin show its favorable properties.

Examples of the naphthol-aralkyl resins include the phenol resins represented by the following General Formula (XXXI) and the like.

[Formula 23]

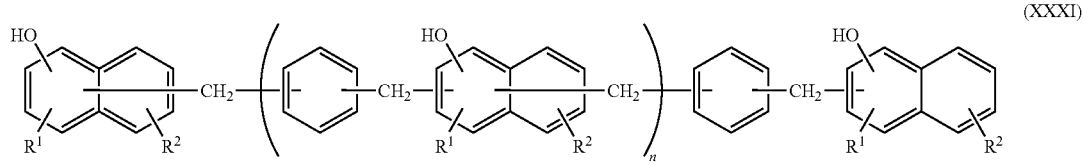
(XXXI)

The naphthol-aralkyl resins represented by General Formula (XXXI) include the resins wherein all of $R^1$ and $R^2$ are hydrogen atoms and the like; and commercially available products of such compounds include SN-170 (trade name, manufactured by Nippon Steel Chemical Co., Ltd.).

Examples of the dicyclopentadiene-based phenol resins include the phenol resins represented by the following General Formula (XXXII) and the like.

[Formula 24]

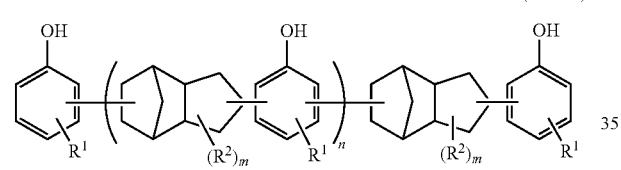
(XXXII)

(wherein, $R^1$ and $R^2$ each independently represent a group selected from a hydrogen atom and substituted or unsubstituted monovalent hydrocarbon group having 1 to 10 carbon atoms; n is an integer of 0 to 10; and m is an integer of 0 to 6).

Compounds in which $R^1$ and $R^2$ are hydrogen atoms are available on the market, for example, as DPP (trade name, manufactured by Nippon Petrochemicals Co., Ltd.).

Examples of the triphenylmethane-based phenol resins include the phenol resins represented by the following General Formula (XXXIII) and the like.

[Formula 25]

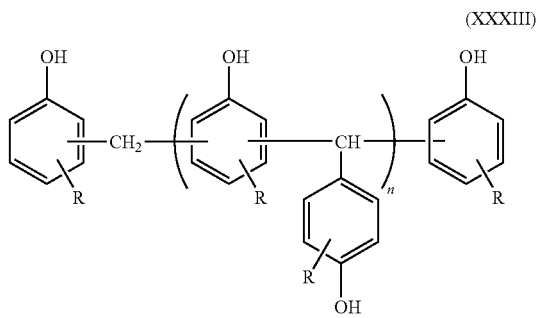
(XXXIII)

(wherein, R is a group selected from a hydrogen atom and substituted or unsubstituted monovalent hydrocarbon groups having 1 to 10 carbon atoms, and n is an integer of 1 to 10).

Compounds in which R is a hydrogen atom are available as commercial products such as MEH-7500 (trade name, manufactured by Meiwa Plastic Industries, Ltd.).

Examples of the novolak phenol resins include phenolic novolak resins, cresol novolak resins, naphthol novolak resins and the like; and among them, phenolic novolak resins are preferable.

Examples of the biphenylene-based phenol-aralkyl resins include the phenol resins represented by the following General Formula (XXXXXII), and the like.

[Formula 26]

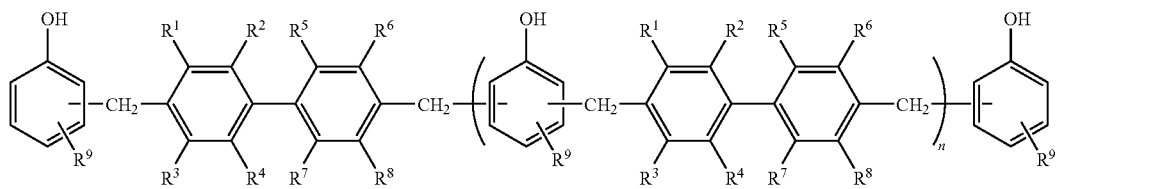
(XXXXXII)

In Formula (XXXXXII) above, $R^1$ to $R^9$ each independently represent a group selected from a hydrogen atom, alkyl groups having 1 to 10 carbon atoms such as methyl, ethyl, propyl, butyl, isopropyl, and isobutyl; alkoxyl groups having 1 to 10 carbon atoms such as methoxy, ethoxy, propoxy, and butoxy; aryl groups having 6 to 10 carbon atoms such as phenyl, toluyl, and xylyl; and aralkyl groups having 6 to 10 carbon atoms such as benzyl and phenethyl and may be the same or different from each other; and among them, a hydrogen atom and a methyl group are preferable. n is an integer of 0 to 10.

Examples of the biphenylene-based phenol-aralkyl resin represented by General Formula (XXXXXII) include resins in which all of $R^1$ to $R^9$ are hydrogen atoms; and among them, condensate mixtures containing a condensate in which n is one or more in an amount of 50 wt % or more are preferable from the viewpoint of melt viscosity. Commercially available products of such compounds include MEH-7851 (trade name, manufactured by Meiwa Plastic Industries, Ltd.).

The phenol-aralkyl resins, naphthol-aralkyl resins, dicyclopentadiene-based phenol resins, triphenylmethane-based phenol resins, novolak phenol resins, and biphenylene-based phenol-aralkyl resins may be used alone or in combination of two or more.

The silicon-containing polymer (F) for use in the present invention is not particularly limited, if it has the following bonds (c) and (d), a functional group selected from $R^1$, a hydroxyl group and an alkoxy group as the terminal group, and an epoxy equivalence of 500 to 4,000; and examples thereof include branched polysiloxanes and the like.

[Formula 27]

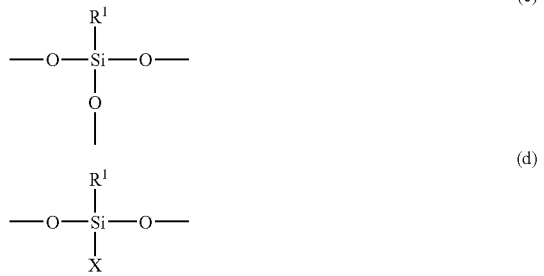

(wherein, $R^1$ represents a group selected from substituted or unsubstituted monovalent hydrocarbon groups having 1 to 12 carbon atoms; the groups $R^1$ in the silicon-containing polymer may be the same as or different from each other; and X represents an epoxy group-containing monovalent organic group).

Examples of the group $R^1$ in General Formulae (c) and (d) above include alkyl groups such as methyl, ethyl, propyl, butyl, isopropyl, isobutyl, tert-butyl, pentyl, hexyl, heptyl, octyl, and 2-ethylhexyl; alkenyl groups such as vinyl, allyl, butenyl, pentenyl, and hexenyl; aryl groups such as phenyl, toluyl, xylyl, naphthyl, and biphenyl; aralkyl groups such as benzyl and phenethyl; and the like; and a methyl or phenyl group is particularly preferable.

Examples of the group X in General Formula (c) above include 2,3-epoxypropyl, 3,4-epoxybutyl, 4,5-epoxypentyl, 2-glycidoxyethyl, 3-glycidoxypropyl, 4-glycidoxybutyl, 2-(3,4-epoxycyclohexyl)ethyl, and 3-(3,4-epoxycyclohexyl) propyl groups, and the like; and among them, a 3-glycidoxypropyl group is preferable.

The terminal of the silicon-containing polymer (F) preferably has the group $R^1$ above or a hydroxyl or alkoxy group from the point of polymer storage stability. In such a case, the alkoxy group is, for example, a methoxy, ethoxy, propoxy, or butoxy group. In addition, the epoxy equivalence of the silicon-containing polymer (F) is preferably in the range of 500 to 4,000 and more preferably in the range of 1,000 to 2,500. An epoxy equivalence of less than 500 may lead to deterioration in the flow ability of the sealant epoxy-resin molding material, while that of more than 4,000 to easier exudation thereof onto the hardened product surface and consequently to molding defects.

The silicon-containing polymer (F) preferably has the following bond (e) additionally, from the view points of the balance between flow ability and warpage resistance of the sealant epoxy-resin molding material obtained.

[Formula 28]

(wherein, $R^1$ represents a group selected from substituted or unsubstituted monovalent hydrocarbon groups having 1 to 12 carbon atoms, and the groups $R^1$ in the silicone-containing polymer may be the same as or different from each other).

Examples of the group $R^1$ in General Formula (e) above include alkyl groups such as methyl, ethyl, propyl, butyl, isopropyl, isobutyl, tert-butyl, pentyl, hexyl, heptyl, octyl, and 2-ethylhexyl; alkenyl groups such as vinyl, allyl, butenyl, pentenyl, and hexenyl; aryl groups such as phenyl, toluyl, xylyl, naphthyl, and biphenyl; aralkyl groups such as benzyl and phenethyl; and the like; and among them, a methyl or phenyl group is preferable.

The softening point of the silicon-containing polymer (F) is preferably controlled to 40° C. to 120° C., more preferably 50° C. to 100° C. A softening point of lower than 40° C. may lead to deterioration in mechanical strength of the hardened product of the sealant epoxy-resin molding material obtained, while that of higher than 120° C. to deterioration in dispersion efficiency of the silicon-containing polymer (F) in the sealant epoxy-resin molding material. It is possible to control the softening temperature of the silicon-containing polymer (F), by properly determining the molecular weight of silicon-containing polymer (F), the constituent binding units (e.g., content ratio of bonds (c) through (e)), and the kind of the organic group binding to the silicon atom. It is particularly preferable to control the softening point by adjusting the content of aryl groups in the silicon-containing polymer (F), from the viewpoints of the dispersibility of the silicon-containing polymer (F) in the sealant epoxy-resin molding material and the flow ability of the sealant epoxy-resin molding material obtained. In such a case, the aryl group is, for example, a phenyl, toluyl, xylyl, naphthyl, or biphenyl group, or the like. A phenyl group is more preferable. It is possible to obtain a silicon-containing polymer (F) having a desirable softening point, by adjusting the content of the phenyl groups in the monovalent organic group bound to the silicon atoms in the silicon-containing polymer (F) to preferably 60 to 99 mol %, more preferably 70 to 85 mol %. The rate of the substituted or unsubstituted phenyl groups having 1 to 12 carbon atoms in all groups $R^1$ in the silicon-containing polymer (F) is preferably 60 to 100 mol %.

The weight-average molecular weight (Mw) of the silicon-containing polymer (F), as determined by gel permeation chromatography (GPC) and by using a standard polystyrene calibration curve, is preferably 1,000 to 30,000, more preferably 2,000 to 20,000, and still more preferably 3,000 to 10,000. The silicon-containing polymer (F) is preferably a random copolymer.

The silicon-containing polymer (F) can be prepared according to the method described below, and commercial products thereof such as AY42-119 (trade name, manufactured by Dow Corning Toray Silicone Co., Ltd.) are also available.

The method of preparing the silicon-containing polymer (F) is not particularly limited, and any one of known methods may be used for preparation. For example, the polymer can be prepared by dissolving and hydrolytic condensing an organochlorosilane, organoalkoxysilane, siloxane, or partial hydrolytic condensate thereof that gives the units (c) to (e) in hydrolytic condensation reaction in a mixed solvent. The mixed solvent is a mixture of an organic solvent capable of dissolving both raw materials and reaction products and water in an amount capable of hydrolyzing all hydrolysable groups in the raw materials. It is preferable then to use an organoalkoxysilane and/or siloxane as raw materials, for reduction in the amount of the chlorine impurities remaining in the sealant epoxy-resin molding material. It is preferable in such a case to add an acid, base or organic metal compound as the catalyst for accelerating the reaction.

Examples of the organoalkoxysilanes and/or siloxanes, raw materials of the silicon-containing polymer (A), include methyltrimethoxysilane, methyltriethoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, methylphenyldimethoxysilane, methylvinyldimethoxysilane, phenylvinyldimethoxysilane, diphenyldimethoxysilane, methylphenyldiethoxysilane, methylvinyl diethoxysilane, phenylvinyldiethoxysilane, diphenyldiethoxysilane, dimethyldiethoxysilane, tetramethoxysilane, tetraethoxysilane, dimethoxydiethoxysilane, 3-glycidoxypropyltrimethoxysilane, 3-glycidoxypropyltriethoxysilane, 3-glycidoxypropyl(methyl)dimethoxysilane, 3-glycidoxypropyl(methyl)diethoxysilane, 3-glycidoxypropyl(phenyl)dimethoxysilane, 3-glycidoxypropyl(phenyl)diethoxysilane, 2-(3,4-epoxycyclohexyl)ethyl(methyl)dimethoxysilane, 2-(3,4-epoxycyclohexyl)ethyl(methyl)diethoxysilane, 2-(3,4-epoxycyclohexyl)ethyl(phenyl)dimethoxysilane, 2-(3,4-epoxycyclohexyl)ethyl(phenyl)diethoxysilane, the hydrolytic condensates thereof, and the like.

The content of the silicon-containing polymer (F) is preferably 0.2 to 1.5 wt %, more preferably 0.3 to 1.3 wt %, in the sealant epoxy-resin molding material. A content of less than 0.2 wt % may lead to decrease in the favorable effects of adding the silicon-containing polymer (F), while a content of more than 1.5 wt % to deterioration in the hardness of the sealant epoxy-resin molding material obtained when hot.

The sealant epoxy-resin molding material according to the present invention may contain acenaphthylene for improvement in flame resistance. Acenaphthylene may be prepared by dehydrogenation of acenaphthene, or alternatively, a commercial product may be used. Yet alternatively, an acenaphthylene polymer or a copolymer of acenaphthylene with another aromatic olefin may be used. The methods of preparing the acenaphthylene polymer or the copolymer of acenaphthylene with another aromatic olefin include radical, cationic, and anionic polymerizations, and the like. Any one of known catalysts may be used in polymerization, or alternatively, the polymerization may be performed only by heat without using a catalyst. The polymerization temperature then is preferably 80 to 160° C. and more preferably 90 to 150° C. The softening temperature of the acenaphthylene polymer or the copolymer of acenaphthylene with another aromatic olefin obtained is preferably 60 to 150° C. and more preferably 70 to 130° C. A softening temperature lower than 60° C. may lead to deterioration in moldability because of the exudation during molding, while that of higher than 150° C. to deterioration in compatibility to the resin.

Examples of the other aromatic olefins copolymerized with acenaphthylene include styrene, α-methylstyrene, indene, benzothiophene, benzofuran, vinylnaphthalene, vinylbiphenyl, the alkyl-substituted derivatives thereof, and the like. In addition to the aromatic olefin above, an aliphatic olefin may be used in combination in the range that does not impair the advantageous effects of the present invention. Examples of the aliphatic olefins include (meth) acrylic acid and the esters thereof, maleic an hydride, itaconic anhydride, fumaric acid and the esters thereof, and the like. The amount of the aliphatic olefin used is preferably 20 wt % or less, more preferably 9 wt % or less, with respect to the total amount of the polymerization monomers.

Acenaphthylene previously mixed with part or all of the hardening agent (B) may be used as the acenaphthylene. Alternatively, a previously prepared mixture of part or all of the hardening agent (B) with one or more of acenaphthylene, an acenaphthylene polymer, and a copolymer of acenaphthylene with another aromatic olefin may be used. The premixing methods include, for example, a method of pulverizing the hardening agent (B) and the acenaphthylene components respectively into fine particles and mixing them in the solid state, a method of dissolving these components in a high-solubility solvent uniformly and then removing the solvent, a method of melt-mixing the hardening agent (B) and the acenaphthylene component at a temperature of the softening point of the hardening agent (B) and/or the acenaphthylene component or more, and the like; and the melting-mixing method is preferably, because it gives a mixture higher in uniformity and smaller in the amount of impurities. The temperature of melt-mixing is not particularly limited, if it is not lower than the softening temperatures of the hardening agent (B) and/or the acenaphthylene component, but is preferably 100 to 250° C. and more preferably 120 to 200° C. The period of melt-mixing is also not particularly limited if the components are mixed uniformly, but preferably 1 to 20 hours and more preferably 2 to 15 hours.

When the hardening agent (B) and a cenaphthylene are premixed, the acenaphthylene component may polymerize or react with the hardening agent (B) during mixing. In the sealant epoxy-resin molding material according to the present invention, the premixture (acenaphthylene-modified hardening agent) described above is preferably contained in the hardening agent (B) in an amount of 90 wt % or more, for improvement in the flame resistance due to the dispersibility of the acenaphthylene components. The content of acenaphthylene and/or the aromatic olefinic polymer including acenaphthylene in the acenaphthylene-modified hardening agent is preferably 5 to 40 wt % and more preferably 8 to 25 wt %. A content of less than 5 wt % may lead to deterioration in flame resistance, while a content of more than 40 wt % to deterioration in moldability. The content of the acenaphthylene structure in the epoxy resin molding material according to the present invention is preferably 0.1 to 5 wt %, more preferably 0.3 to 3 wt %, from the viewpoints of flame resistance and moldability. A content of less than 0.1 wt % may lead to deterioration in flame resistance, while a content of more than 5 wt % to deterioration in moldability.

The equivalence ratio of the epoxy resin (A) to the hardening agent (B), i.e., the ratio in number of the hydroxyl groups in hardening agent to the epoxy groups in epoxy resin (hydroxyl group number in hardening agent/epoxy group number in epoxy resin) is not particularly limited, but is preferably adjusted in the range of 0.5 to 2, more preferably 0.6 to 1.3, for reduction of the respective unreacted groups. It is more preferably adjusted in the range of 0.8 to 1.2, for obtaining a sealant epoxy-resin molding material superior in moldability and reflow resistance.

The sealant epoxy-resin molding material according to the present invention may contain a hardening accelerator (C) as needed for acceleration of the reaction between epoxy resin (A) and hardening agent (B). The hardening accelerator (C) is not particularly limited if it is commonly used in sealant epoxy-resin molding materials, and examples thereof include cycloamidine compounds such as 1,8-diaza-bicyclo(5,4,0) undecene-7,1,5-diaza-bicyclo(4,3,0)nonene, and 5,6-dibutylamino-1,8-diaza-bicyclo(5,4,0)undecene-7; and intramolecular polarized compounds prepared by adding to the compound above with a π bond-containing compound such as maleic anhydride, a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, or phenyl-1,4-benzoquinone, diazo phenylmethane or phenol resin; tertiary amines and the derivatives thereof such as benzyldimethylamine, triethanolamine, dimethylaminoethanol, and tris(dimethylaminomethyl)phenol; imidazoles and the derivatives thereof such as 2-methylimidazole, 2-phenylimidazole, 2-phenyl-4-methylimidazole; phosphine compounds such as tributylphosphine, methyldiphenylphosphine, triphenylphosphine, tris(4-methylphenyl)phosphine, diphenylphosphine, and phenylphosphine; and the intramolecular polarized phosphorus compounds prepared by adding, to the phosphine compounds above, a π bond-containing compound such as maleic anhydride, the quinone compound above, or diazo phenylmethane or phenol resin; tetraphenylboron salts and the derivatives thereof such as tetraphenylphosphonium tetraphenyl borate, triphenylphosphine tetraphenyl borate, 2-ethyl-4-methylimidazole tetraphenyl borate, and N-methylmorpholine tetraphenyl borate; and the like, and these compounds may be use alone or in combination of two or more.

Among them, triphenylphosphine is preferable from the viewpoints of flame resistance and hardening efficiency; and adducts of a tertiary phosphine compound and a quinone compound are preferable from the viewpoints of flame resistance, hardening efficiency, flowability and release characteristics. Favorable examples of the tertiary phosphine compounds include, but are not limited to, tertiary phosphine compounds having alkyl or aryl groups such as tricyclohexylphosphine, tributylphosphine, dibutylphenylphosphine, butyl diphenylphosphine, ethyldiphenylphosphine, triphenylphosphine, tris(4-methylphenyl)phosphine, tris(4-ethylphenyl)phosphine, tris(4-propylphenyl)phosphine, tris(4-butylphenyl)phosphine, tris(isopropylphenyl)phosphine, tris (tert-butylphenyl)phosphine, tris(2,4-dimethylphenyl) phosphine, tris(2,6-dimethylphenyl)phosphine, tris(2,4,6-trimethylphenyl)phosphine, tris(2,6-dimethyl-4-ethoxyphenyl)phosphine, tris(4-methoxyphenyl)phosphine, tris(4-ethoxyphenyl)phosphine, and the like. Examples of the quinone compounds include o-benzoquinone, p-benzoquinone, diphenoquinone, 1,4-naphthoquinone, anthraquinone, and the like; and among them, p-benzoquinone is preferable from the viewpoints of moisture resistance and storage stability. An adduct of tris(4-methylphenyl) phosphine and p-benzoquinone is more preferable from the viewpoint of release characteristics.

The blending amount of the hardening accelerator is not particularly limited, if it is sufficient for showing a hardening-acceleration effect, but is preferably 0.005 to 2 wt %, more preferably 0.01 to 0.5 wt %, with respect to the sealant epoxy-resin molding material. An amount of less than 0.005 wt % may lead to deterioration in short-term hardening efficiency, while an amount of more than 2 wt % to an excessive high hardening velocity, making it difficult to obtain a favorable molded product.

In the present invention, an inorganic filler (D) may be blended as needed. Addition of an inorganic filler is effective in reducing hygroscopicity and linear expansion coefficient and in increasing heat conductivity and strength, and examples thereof include powders of fused silica, crystalline silica, alumina, zircon, calcium silicate, calcium carbonate, potassium titanate, silicon carbide, silicon nitride, aluminum nitride, boron nitride, beryllia, zirconia, zircon, forsterite, steatite, spinel, mullite, titania, and the like; the spherical beads thereof, glass fiber, and the like. Examples of the flame-retarding inorganic fillers include aluminum hydroxide, magnesium hydroxide, composite metal hydroxides, zinc borate, zinc molybdenate, and the like. Commercially available zinc borate products include FB-290 and FB-500 (manufactured by U.S. Borax), FRZ-500C (manufactured by Mizusawa Industrial Chemicals, Ltd.), and the like; and those of zinc molybdenate include KEMGARD 911B, 911C, and 1100 (manufactured by Sherwin-Williams) and the like.

These inorganic fillers may be used alone or in combination of two or more. Among them, fused silica is preferable from the viewpoint of performance of filling and low linear expansion coefficient; alumina is preferable from the point of high heat conductivity; and the inorganic filler is preferably spherical in shape from the points of performance of filling and abrasion to mold.

The amount of the inorganic filler blended is preferably 50 wt % or more with respect to the sealant epoxy-resin molding material, from the viewpoints of flame resistance, moldability, low hygroscopicity, low linear expansion coefficient, high strength and reflow resistance, preferably 60 to 95 wt % from the viewpoint of flame resistance and still more preferably 70 to 90 wt %. An amount of less than 60 wt % may lead to deterioration in flame resistance and reflow resistance, while an amount of more than 95 wt % to insufficient flowability and also to deterioration in flame resistance.

When an inorganic filler (D) is used, a coupling agent (E) is preferably added to the sealant epoxy-resin molding material according to the present invention, for improvement in adhesiveness between the resin components and the filler. The coupling agent (E) is not particularly limited if it is commonly used in sealant epoxy-resin molding materials, and examples thereof include various silane compounds such as primary, secondary and/or tertiary amino group-containing silane compounds, epoxysilanes, mercaptosilanes, alkylsilanes, ureidosilanes, and vinylsilanes; titanium compounds, aluminum chelates, aluminum/zirconium compounds, and the like. Typical examples thereof include silane coupling agents such as vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-anilinopropyltrimethoxysilane, γ-anilinopropyltriethoxysilane, γ-(N,N-dimethyl)aminopropyltrimethoxysilane, γ-(N,N-diethyl)aminopropyltrimethoxysilane, γ-(N,N-dibutyl)aminopropyltrimethoxysilane, γ-(N-methyl)anilinopropyltrimethoxysilane, γ-(N-ethyl)anilinopropyltrimethoxysilane, γ-(N,N-dimethyl)aminopropyltriethoxysilane, γ-(N,N-diethyl)aminopropyltriethoxysilane, γ-(N,N-dibutyl)aminopropyltriethoxysilane, γ-(N-methyl)anilinopropyltriethoxysilane, γ-(N-ethyl)anilinopropyltriethoxysilane, γ-(N,N-dimethyl)aminopropylmethyldimethoxysilane, γ-(N,N-diethyl)aminopropylmethyldimethoxysilane, γ-(N,N-dibutyl)aminopropylmethyldimethoxysilane, γ-(N-methyl)anilinopropylmethyldimethoxysilane, γ-(N-ethyl)anilinopropylmethyldimethoxysilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, γ-chloropropyltrimethoxysilane, hexamethyldisilane, vinyltrimethoxysilane, and γ-mercaptopropylmethyldimethoxysilane; titanate coupling agents such as isopropyl triisostearoyltitanate, isopropyl tris(dioctylpyrophosphate) titanate, isopropyl tri(N-aminoethyl-aminoethyl) titanate, tetraoctyl bis(ditridecylphosphite) titanate tetra(2,2-diallyloxymethyl-1-butyl) bis(ditridecyl) phosphite titanate, bis(dioctylpyrophosphate) oxyacetate titanate, bis(dioctylpyrophosphato)ethylene titanate, isopropyltrioctanoyl titanate, isopropyldimethacrylisostearoyl titanate, isopropyltridodecyl benzenesulfonyl titanate, isopropylisostearoyldiacryl titanate, isopropyl tri(dioctylphosphate) titanate, isopropyltricumylphenyl titanate, and tetraisopropyl bis(dioctylphosphite) titanate; and the like, and these compounds may be use alone or in combination of two or more.

Among them, secondary amino group-containing silane-coupling agents are preferable from the viewpoints of flowability and flame resistance. The secondary amino group-containing silane-coupling agent is not particularly limited if it is a silane compound having a secondary amino group in the molecule, and examples thereof include
γ-anilinopropyltrimethoxysilane,
γ-anilinopropyltriethoxysilane,
γ-anilinopropylmethyldimethoxysilane,
γ-anilinopropylmethyldiethoxysilane,
γ-anilinopropylethyldiethoxysilane,
γ-anilinopropylethyldimethoxysilane,
γ-anilinomethyltrimethoxysilane,
γ-anilinomethyltriethoxysilane,
γ-anilinomethylmethyldimethoxysilane,
γ-anilinomethylmethyldiethoxysilane,
γ-anilinomethylethyldiethoxysilane,
γ-anilinomethylethyldimethoxysilane,
N-(p-methoxyphenyl)-γ-aminopropyltrimethoxysilane,
N-(p-methoxyphenyl)-γ-aminopropyltriethoxysilane,
N-(p-methoxyphenyl)-γ-aminopropylmethyldimethoxysilane,
N-(p-methoxyphenyl)-γ-aminopropylmethyldiethoxysilane,
N-(p-methoxyphenyl)-γ-aminopropylethyldiethoxysilane,
N-(p-methoxyphenyl)-γ-aminopropylethyldimethoxysilane,
γ-(N-methyl)aminopropyltrimethoxysilane,
γ-(N-ethyl)aminopropyltrimethoxysilane,
γ-(N-butyl)aminopropyltrimethoxysilane,
γ-(N-benzyl)aminopropyltrimethoxysilane,
γ-(N-methyl)aminopropyltriethoxysilane,
γ-(N-ethyl)aminopropyltriethoxysilane,
γ-(N-butyl)aminopropyltriethoxysilane,
γ-(N-benzyl)aminopropyltriethoxysilane,
γ-(N-methyl)aminopropylmethyldimethoxysilane,
γ-(N-ethyl)aminopropylmethyldimethoxysilane,
γ-(N-butyl)aminopropylmethyldimethoxysilane,
γ-(N-benzyl)aminopropylmethyldimethoxysilane,
N-β-(aminoethyl)-γ-aminopropyltrimethoxysilane,
γ-(β-aminoethyl)aminopropyltrimethoxysilane,
N-β-(N-vinylbenzylaminoethyl)-γ-aminopropyltrimethoxysilane,
and the like. Among them, particularly preferable are the aminosilane-coupling agents represented by the following General Formula (III):

[Formula 29]

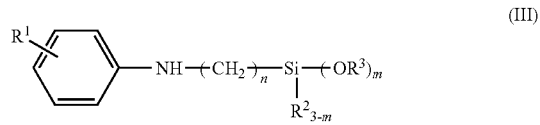

(wherein, $R^1$ represents a group selected from a hydrogen atom, alkyl groups having 1 to 6 carbon atoms, and alkoxy group having 1 to 2 carbon atoms; $R^2$ represents a group selected from alkyl group having 1 to 6 carbon atoms and a phenyl group; $R^3$ represents a methyl or ethyl group; n is an integer of 1 to 6; and m is an integer of 1 to 3).

The total blending amount of the coupling agents is preferably 0.037 to 4.75 wt %, more preferably 0.05 to 5 wt %, and still more preferably 0.1 to 2.5 wt %, with respect to the sealant epoxy-resin molding material. An amount of less than 0.037 wt % may lead to deterioration in the adhesiveness to frame, while an amount of more than 4.75 wt % to deterioration in package moldability.

A known non-halogen, non-antimony flame retardant may be blended as needed in the sealant epoxy-resin molding material according to the present invention for further improvement in flame resistance. Examples thereof include phosphorus compounds such as red phosphorus, red phosphorus coated with an inorganic compound such as zinc oxide or a thermosetting resin such as phenol resin, phosphoric ester coated as above, and phosphine oxide; triazine ring-containing compounds such as melamine, melamine derivatives, and melamine-modified phenol resins; nitrogen-containing compounds such as cyanuric acid derivatives and isocyanuric acid derivatives; phosphorus and nitrogen-containing compounds such as cyclophosphazene; metal element-containing compounds such as aluminum hydroxide, magnesium hydroxide, composite metal hydroxides, zinc oxide, zinc stannate, zinc borate, iron oxide, oxidation molybdenum, zinc molybdenate, and dicyclopentadienyliron; and the like, and these compounds may be used alone or in combination of two or more.

Among them, phosphoric esters, phosphine oxide and cyclophosphazene are preferable, from the view point of flowability. The phosphoric ester is not particularly limited if it is an ester compound from phosphoric acid and an alcohol or phenol compound, and examples thereof include trimethyl phosphate, triethyl phosphate, triphenyl phosphate, tricresyl phosphate, trixylenyl phosphate, cresyl diphenyl phosphate, xylenyl diphenyl phosphate, tris(2,6-dimethylphenyl) phosphate, condensed aromatic phosphoric esters, and the like. Among them, the condensed aromatic phosphoric esters represented by the following General Formula (XXXIV) are preferable from the viewpoint of hydrolysis resistance.

[Formula 30]

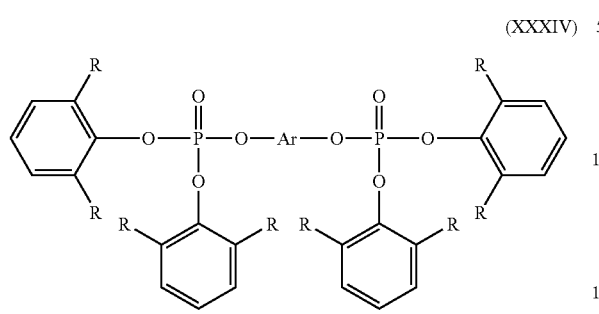
(XXXIV)

Examples of the phosphoric ester represented by Formula (XXXIV) above include the phosphoric esters represented by the following formulae (XXXV) to (XXXIX), and the like.

[Formula 31]

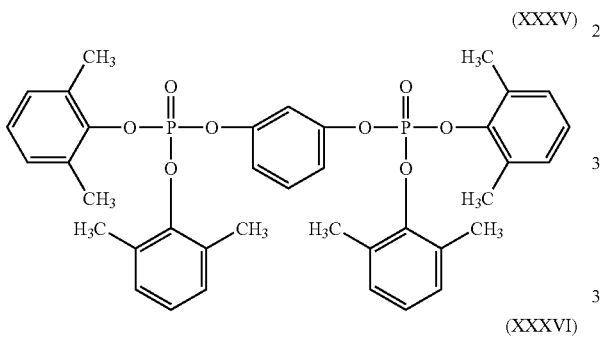
(XXXV)

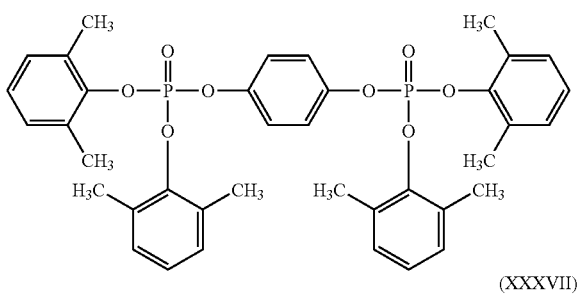
(XXXVI)

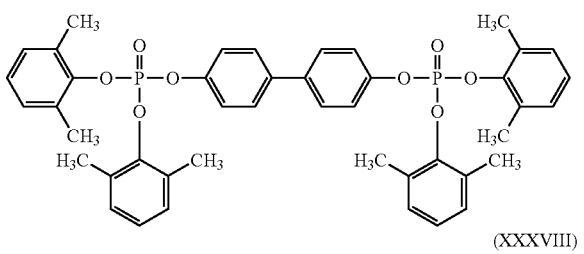
(XXXVII)

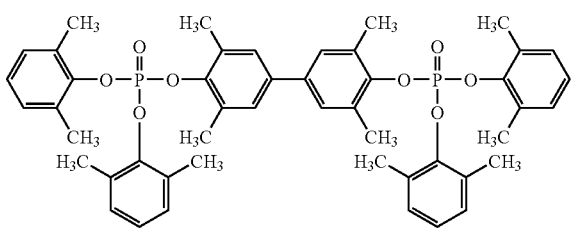
(XXXVIII)

-continued

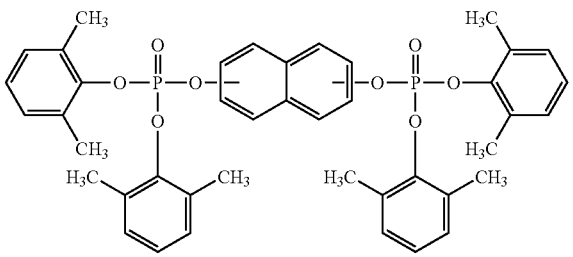
(XXXIX)

The amount of the phosphoric ester added is preferably in the range of 0.2 to 3.0 wt % as phosphorus atom with respect to the total amount of all components other than the filler. An amount of less than 0.2 wt % may lead to deterioration in flame retarding effect. An amount of more than 3.0 wt % may lead to deterioration in moldability and moisture resistance and exudation of the phosphoric ester during molding, and consequently to deterioration in appearance.

When used as a flame retardant, the phosphine oxide is preferably a compound represented by the following General Formula (XXXX).

[Formula 32]

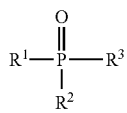
(XXXX)

(wherein, $R^1$, $R^2$ and $R^3$ each represent a substituted or unsubstituted alkyl, aryl, or aralkyl group having 1 to 10 carbon atoms or a hydrogen atom and these groups may be the same as or different from each other; however, all of the groups are not hydrogen atoms at the same time).

Among the phosphorus compounds represented by General Formula (XXXX), those having substituted or unsubstituted aryl groups as $R^1$ to $R^3$ are preferable from the viewpoint of hydrolysis resistance, and those having phenyl groups are particularly preferable.

The amount of the phosphine oxide blended is preferably 0.01 to 0.2 wt % as phosphorus atom with respect to the sealant epoxy-resin molding material. It is more preferably 0.02 to 0.1 wt % and still more preferably 0.03 to 0.08 wt %. An amount of less than 0.01 wt % may lead to deterioration in flame resistance, while an amount of more than 0.2 wt % to deterioration in moldability and moisture resistance.

Examples of the cyclophosphazenes include cyclic phosphazene compounds having the groups represented by the following Formula (XXXXI) and/or the following Formula (XXXXII) as recurring units in the main chain skeleton, the isomers of the compounds having the groups represented by the following Formula (XXXXIII) and/or the following Formula (XXXXIV) as recurring units different in the substitution site of the phosphorus atoms in the phosphazene ring, and the like.

[Formula 33]

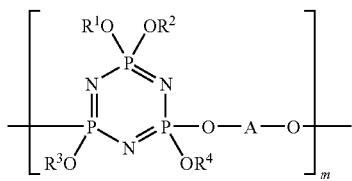

(XXXXI)

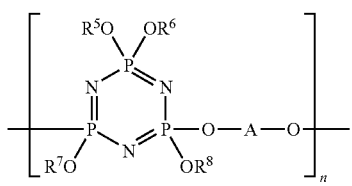

(XXXXII)

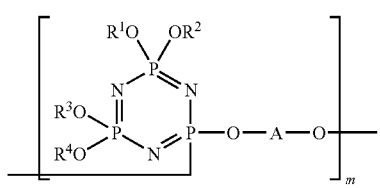

(XXXXIII)

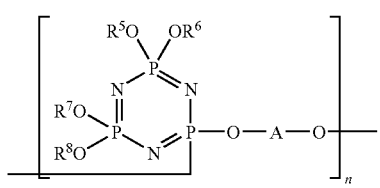

(XXXXIV)

In Formulae (XXXXI) and (XXXXIII), m is an integer of 1 to 10; $R^1$ to $R^4$ each represent a group selected from alkyl and aryl groups having 1 to 12 carbon atoms that may be substituted and a hydroxyl group, and may be the same as or different from each other. A represents an alkylene group having 1 to 4 carbon atoms or arylene group. In Formulae (XXXXII) and (XXXXIV), n is an integer of 1 to 10; $R^5$ to $R^8$ each represent a group selected from alkyl and aryl groups having 1 to 12 carbon atoms that may be substituted, and may be the same as or different from each other; and A represents an alkylene group having 1 to 4 carbon atoms or arylene group. Also in the Formulae, all m groups of $R^1$, $R^2$, $R^3$, and $R^4$ may be the same as or different from each other, and all n groups of $R^5$, $R^6$, $R^7$, and $R^8$ may be the same as or different from each other. In Formulae (XXXXI) to (XXXXIV), the alkyl or aryl group having 1 to 12 carbon atoms that may be substituted represented by $R^1$ to $R^8$ is not particularly limited, and examples thereof include alkyl groups such as methyl, ethyl, propyl, isopropyl, butyl, isobutyl, sec-butyl, and tert-butyl; aryl groups such as phenyl, 1-naphthyl, and 2-naphthyl group; alkyl group-substituted aryl groups such as o-toluyl, m-toluyl, p-toluyl, 2,3-xylyl, 2,4-xylyl, o-cumenyl, m-cumenyl, p-cumenyl, and mesityl; aryl group-substituted alkyl groups such as benzyl and phenethyl; and the like, and examples of the substituent groups to the group include alkyl groups, alkoxyl groups, aryl groups, a hydroxyl group, an amino group, an epoxy group, a vinyl group, hydroxyalkyl groups, alkylamino groups and the like.

Among them, aryl groups are preferable, and a phenyl or hydroxyphenyl group is more preferable, from the viewpoints of the heat resistance and moisture resistance of the epoxy resin molding material.

Also in Formulae (XXXXI) to (XXXXIV), the alkylene or arylene group having 1 to 4 carbon atoms represented by A is not particularly limited, and example thereof include methylene, ethylene, propylene, isopropylene, butylene, isobutylene, phenylene, tolylene, xylylene, and naphthylene groups, and the like; an arylene groups are preferable from the viewpoints of the heat resistance and moisture resistance of the epoxy resin molding material, and among them, a phenylene group is more preferable.

The cyclic phosphazene compound may be a polymer of one of the units represented by Formulae (XXXXI) to (XXXXIV) or a copolymer of the units represented by Formulae (XXXXI) and (XXXXII) or by Formulae (XXXXIII) and (XXXXIV); and, if it is a copolymer, the copolymer may be a random, block or alternating copolymer. The copolymerization molar ratio m/n is not particularly limited, but preferably 1/0 to 1/4, more preferably 1/0 to 1/1.5, for improvement in the heat resistance and strength of the hardened epoxy-resin product. The polymerization degree m+n is 1 to 20, preferably 2 to 8, and more preferably 3 to 6.

Favorable examples of the cyclic phosphazene compounds include the polymers represented by the following Formula (XXXXV), the copolymers represented by the following Formula (XXXXVI), and the like.

[Formula 34]

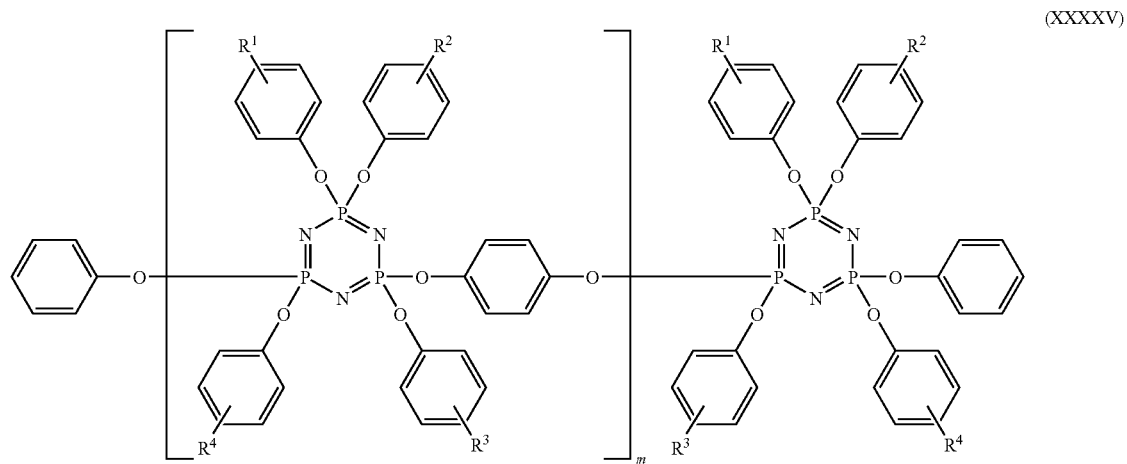

(in Formula (XXXXV), m is an integer of 0 to 9; and $R^1$ to $R^4$ each independently represent a hydrogen atom or a hydroxyl group).

[Formula 35]

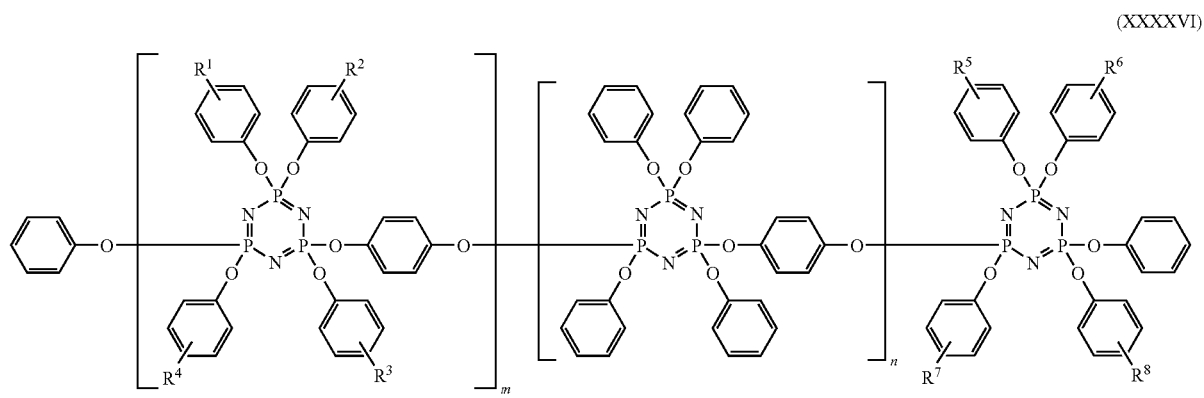

In Formula (XXXXVI) above, each of m and n is an integer of 0 to 9; $R^1$ to $R^4$ each independently represent a hydrogen atom or a hydroxyl group; and $R^5$ to $R^8$ each independently represent a hydrogen atom or a hydroxyl group. The cyclic phosphazene compound represented by Formula (XXXXVI) above may be a copolymer containing m recurring units (a) and n recurring units (b) shown below alternately, blockwise, or random, but preferably a random copolymer.

[Formula 36]

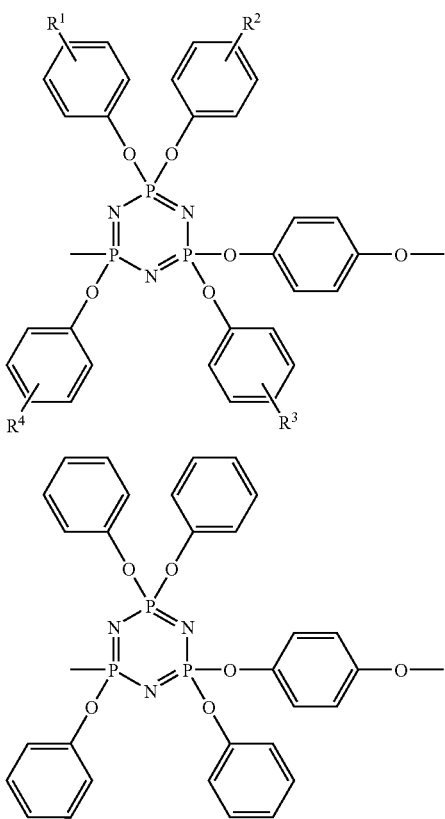

Among them, the cyclic phosphazene compound is preferably a compound containing a polymer in which m in Formula (XXXXV) is 3 to 6 as the principal component, or that containing a copolymer in which all of $R^5$ to $R^8$ in Formula (XXXXVI) are hydrogen atoms, or only one of them is a hydroxyl group, m/n is 1/2 to 1/3, and m+n is 3 to 6, as the principal component. Commercially available phosphazene compounds include SPE-100 (trade name, manufactured by Otsuka Chemical Co., Ltd.).

When used as a flame retardant, the composite metal hydroxide is preferably a compound represented by the following Compositional Formula (XXXXVII).

(Formula 37)

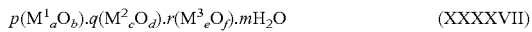
$$p(M^1{}_aO_b).q(M^2{}_cO_d).r(M^3{}_eO_f).mH_2O \qquad \text{(XXXXVII)}$$

(wherein, $M^1$, $M^2$ and $M^3$ represent metal ions that are different from each other; each of a, b, c, d, e, f, p, q and m is a positive number; and r is 0 or a positive number).

Among them, the compounds represented by Formula (XXXXVII) in which r is 0, i.e., compounds represented by the following Formula (XXXXVIII), are more preferable.

(Formula 38)

$$m(M^1{}_aO_b).n(M^2{}_cO_d).l(H_2O) \qquad \text{(XXXXVIII)}$$

(wherein, $M^1$ and $M^2$ represent metal elements different from each other; and each of a, b, c, d, m, n and l is a positive number)

$M^1$, $M^2$ and $M^3$ in Compositional Formulae (XXXXVII) and (XXXXVIII) above are not particularly limited if they are different from each other, but, preferably from the viewpoint of flame-retardant viewpoint, $M^1$ is selected from metal elements in the third period, alkali-earth metal elements in group IIA, and metal elements in groups IVB, IIB, VIII, IB, IIIA and IVA, and $M^2$ is selected from transition metal elements in groups IIIB to IIB, to make $M^1$ and $M^2$ different from each other; and more preferably, $M^1$ is selected from magnesium, calcium, aluminum, tin, titanium, iron, cobalt, nickel, copper and zinc, and $M^2$ is selected from iron, cobalt, nickel, copper and zinc. Preferably from the viewpoint of flowability, $M^1$ is magnesium and $M^2$ is zinc or nickel; and more preferably, $M^1$ is magnesium and $M^2$ is zinc.

The molar ratio of p, q, and r in Compositional Formula (XXXXVII) above is not particularly limited, as far as the advantageous effects of the present invention is obtained; but preferably, r is 0, and the molar ratio of p and q, p/q, is 99/1 to 50/50. That is, the molar ratio of m and n, m/n, in Compositional Formula (XXXXVIII) above is preferably 99/1 to 50/50.

Examples of commercially available products include a composite metal hydroxide (magnesium hydroxide and zinc hydroxide solid solution, trade name: ECOMAG Z-10, manufactured by Tateho Chemical Industries Co., Ltd.) in which $M^1$ in the Compositional Formula (XXXXVIII) is magnesium, $M^2$ is zinc, m is 7, n is 3, l is 10, and a, b, c and d are 1. The metal elements described above also include semimetal elements, and thus include all elements excluding nonmetal elements.

Metal elements are determined, based on the long periodic table grouping typical elements in subgroup A and transition elements in subgroup B ("Dictionary of Chemistry 4", reduce-size Ed., 30th, published by Kyoritsu Shuppan Co., Ltd., Feb. 15, 1987).

The shape of the composite metal hydroxide is not particularly limited, but is preferably polyhedron having a suitable thickness rather than in the flat plate shape, from the viewpoints of flowability and performance of filling. Composite metal hydroxides are obtained as polyhedral crystal more easily than metal hydroxides.

The blending amount of the composite metal hydroxide is not particularly limited, but preferably 0.5 to 20 wt %, more preferably, 0.7 to 15 wt %, and still more preferably 1.4 to 12 wt %, with respect to the sealant epoxy-resin molding material. An amount of less than 0.5 wt % may lead to deterioration in flame resistance, while an amount of more than 20 wt % to deterioration in flowability and reflow resistance.

The triazine ring-containing compound is preferably a co-polycondensation product of a phenolic hydroxyl group-containing compound and a triazine derivative with an aldehyde group-containing compound, from the viewpoints of flame resistance and adhesiveness to copper frame.

Examples of the phenolic hydroxyl group-containing compounds include an alkylphenol such as phenol, cresol, xylenol, ethylphenol, butylphenol, nonylphenol or octylphenol; a polyvalent phenol such as resorcin, catechol, bisphenol A, bisphenol F or bisphenol S; phenylphenol; aminophenol; a naphthol such as α-naphthol, β-naphthol, or dihydroxynaphthalene; or resins prepared by condensation or cocondensation of the phenolic hydroxyl group-containing compound above with an aldehyde group-containing compound such as formaldehyde in the presence of an acidic catalyst, and the like. Among them, phenol, cresol, or co-polycondensates thereof with formaldehyde are preferable from the point of moldability.

The triazine derivative is not particularly limited, if it has a triazine ring in the molecule, and examples thereof include guanamine derivatives such as melamine, benzoguanamine, and acetoguanamine; and cyanuric acid derivatives such as cyanuric acid and methyl cyanurate, and these compounds may be used alone or in combination of two or more. Among them, guanamine derivatives such as melamine and benzoguanamine are preferable from the viewpoints of moldability and reliability.

Examples of the aldehyde group-containing compounds include formalin, paraformaldehyde, and the like.

The blending ratio of the aldehyde group-containing compound to the phenolic hydroxyl group-containing compound (aldehyde group-containing compound (mole)/phenolic hydroxyl group-containing compound (mole)) is preferably 0.05 to 0.9, more preferably 0.1 to 0.8, by molar ratio. A blending ratio of less than 0.05 may inhibit the reaction of the aldehyde group-containing compound with the phenolic hydroxyl group, easily, leaving unreacted phenol and thus leading to deterioration in productivity, while that of more than 0.9 may cause gelation during preparation.

The blending ratio of the triazine derivative to the phenolic hydroxyl group-containing compound is preferably 1 to 30 wt % and more preferably 5 to 20 wt %. A ratio of less than 1 wt % leads to deterioration in flame resistance, while a ratio of more than 30 wt % to increase in softening point, leading to deterioration in kneading efficiency during preparation of the molding material. The blending amount (molar ratio) of the aldehyde group-containing compound to the triazine derivative is not particularly limited.

The reaction temperature during preparation of the co-polycondensate of a phenolic hydroxyl group-containing compound, a triazine derivative and an aldehyde group-containing compound is not particularly limited, but is preferably 60 to 120° C. The pH of reaction is preferably 3 to 9 and more preferably, 4 to 8. A pH of lower than 3 leads to easier gelation the resin during preparation resin, while a pH of higher than 9 makes the co-polycondensation between phenolic hydroxyl group-containing compound, triazine derivative, and aldehyde group-containing compound proceed less efficient, and lowers the nitrogen content of the resin prepared.

It is possible to remove the unreacted phenol compound, aldehyde group-containing compound, and others as needed, for example, by heat-distillation under normal or reduced (vacuum) pressure, after reaction of a phenolic hydroxyl group-containing compound with an aldehyde group-containing compound and a triazine derivative. The residual amount of the unreacted phenol compound then is preferably 3% or less. A residual amount of more than 3% leads to deterioration in moldability.

The softening point of the co-polycondensate obtained is preferably 40 to 150° C. A softening temperature of lower than 40° C. may lead to blocking of the resin, while that of higher than 150° C. to deterioration in the kneading efficiency of molding material.

Examples of the co-polycondensates of a phenolic hydroxyl group-containing compound, a triazine derivative and an aldehyde group-containing compound include co-polycondensates represented by the following formulae (XXXXXIII) to (XXXXXVIII).

[Formula 39]

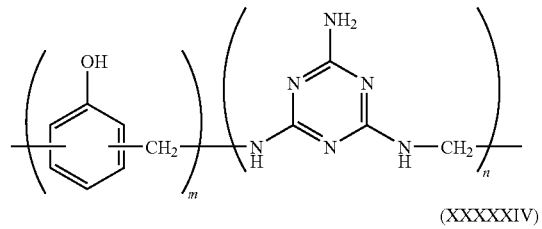
(XXXXXIII)

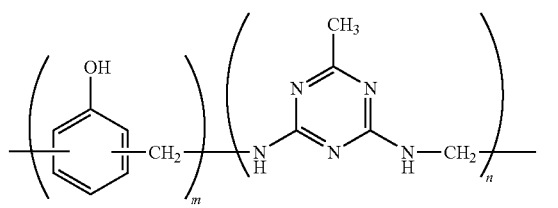
(XXXXXIV)

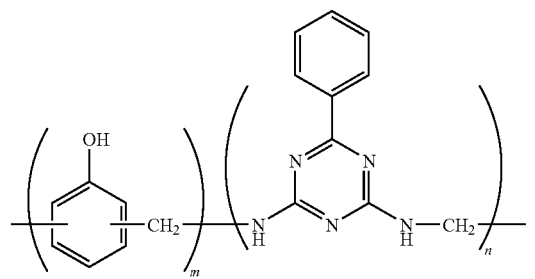
(XXXXXV)

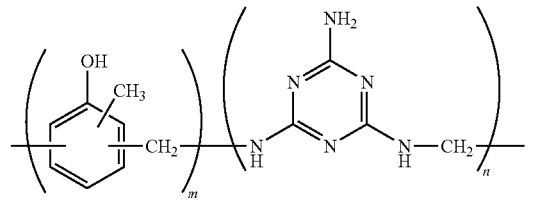
(XXXXXVI)

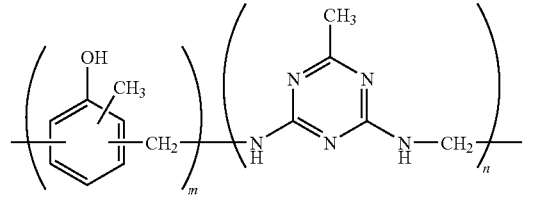
(XXXXXVII)

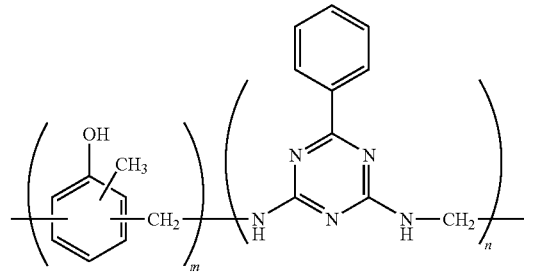
(XXXXXVIII)

A number-average molecular weight of the co-polycondensate of a phenolic hydroxyl group-containing compound, a triazine derivative and analdehyde group-containing compound is preferably 500 to 1,000 and more preferably, 550 to 800. The number-average molecular weight of less than 500 may lead to deterioration in moldability and reflow crack resistance, while that of more than 1,000 to deterioration in flowability. Alternatively, A weight-average molecular weight thereof is preferably 1,500 to 10,000 and more preferably 1,700 to 7,000. The weight-average molecular weight of less than 1,500 may lead to deterioration in reflow crack resistance, while that of more than 10,000 to deterioration in flowability.

Yet alternatively, the molecular weight distribution Mw/Mn of the co-polycondensate of a phenolic hydroxyl group-containing compound, a triazine derivative and an aldehyde group-containing compound is preferably 2.0 to 10.0 and more preferably 3.0 to 6.0. A molecular weight distribution of less than 2.0 may lead to deterioration in reflow crack resistance, while that of more than 10.0 to deterioration in flowability.

Among the co-polycondensates, co-polycondensates of a phenol resin and a triazine derivative with an aldehyde group-containing compound are more preferable from the viewpoint of reflow resistance. The phenol resin for use then is not particularly limited, if it is a resin commonly used in molding materials, and examples thereof include resins prepared by condensation or cocondensation of an alkylphenol such as phenol, cresol, xylenol, ethylphenol, butylphenol, nonylphenol, or octylphenol; a polyvalent phenol such as resorcin, catechol, bisphenol A, bisphenol F, or bisphenol S; a naphthol such as α-naphthol, β-naphthol, or dihydroxynaphthalene; phenol derivative such as phenylphenol, aminophenol; with an aldehyde group-containing compound such as formaldehyde, in the presence of an acidic catalyst, and the like. Among them, phenol-novolak resins, polycondensates of phenol and formaldehyde, are preferable from the point of moldability.

The method of preparing the phenol resin such as that described above is not particularly limited, but the method below is advantageous, because it is possible to prepare a resin that has a molecular weight and a molecular weight distribution in the ranges described in the present invention.

That is, the ratio of the aldehyde group-containing compound to the phenol derivative used in preparing the phenol resin, i.e., the mole number of the aldehyde group-containing compound with respect to 1 mole of phenol derivative, is preferably 0.01 to 2.0 moles and more preferably 0.05 to 1.0 mole. A ratio of less than 0.01 mole may lead to insufficient reaction, resulting in a low-molecular weight resin and deterioration in moldability, heat resistance, water resistance, flame resistance, strength, and others, while a ratio of more than 2.0 moles to excessive increase in molecular weight and thus deterioration in kneading efficiency.

The reaction temperature is preferably 80 to 220° C. and more preferably 100 to 180° C. A temperature of lower than 80° C. may lead to insufficient reactivity and molecular weight and to deterioration in moldability, while a temperature of higher than 250° C. to decrease in productivity in production of the phenol resin.

The reaction period is preferably approximately 1 to 30 hours.

A catalyst, for example, an amine catalyst such as trimethylamine or triethylamine, an acid catalyst such as p-toluenesulfonic acid or oxalic acid, or an alkali catalyst such as sodium hydroxide or ammonia, may be added as needed, in an amount of approximately 0.00001 to 0.01 mole with respect to 1 mole of the phenol derivative.

The pH of the reaction system is preferably 1 to 10.

In this way, it is possible to remove unreacted phenol derivative, aldehyde group-containing compound, water, and the like as needed by heating under reduced pressure after reaction of a phenol derivative with an aldehyde group-containing compound. As for the condition, the temperature is preferably 80 to 220° C., more preferably 100 to 180° C.; the pressure is preferably 100 mm Hg or less, more preferably 60 mm Hg or less; and the period is preferably 0.5 to 10 hours.

As for the amounts of the triazine derivative and the aldehyde group-containing compound used when the triazine derivative and aldehyde group-containing compound are added to and reacted with the phenol resin, the amount of the triazine derivative used is preferably 3 to 50 g, more preferably 4 to 30 g, with respect to 100 g of the polycondensate between the phenol derivative and the aldehyde group-containing compound (phenol resin from which the unreacted phenol derivative, aldehyde group-containing compound, water, and others are removed or not removed by heating under reduced pressure). When a crude resin without the purification above is used, the unreacted phenol derivative is also included in the weight of the polycondensate. The amount of the aldehyde group-containing compound added is preferably 5 to 100 g, more preferably 6 to 50 g, with respect to 100 g of the polycondensate (phenol resin). It is possible to prepare a final co-polycondensate properly adjusted in the favorable ranges of molecular weight distribution and nitrogen-content, by controlling the amounts of the triazine derivative and the aldehyde group-containing compound in the ranges above.

The reaction temperature is preferably 50 to 250° C. and more preferably 80 to 170° C. A temperature of lower than 50° C. may lead to insufficient reaction and low molecular weight and thus to deterioration in moldability, heat resistance, water resistance, flame resistance, strength, and others, while a temperature of higher than 250° C. to lower productivity during production.

The reaction period is preferably, approximately 1 to 30 hours.

An amine catalyst such as trimethylamine or triethylamine or an acid catalyst such as oxalic acid may be used as needed in an amount of approximately 0.00001 to 0.01 mole with respect to 1 mole of the phenol derivative.

The pH of the reaction system is preferably, approximately 1 to 10.

After reaction of the polycondensate (phenol resin) of a phenol derivative and an aldehyde group-containing compound with a triazine derivative and an aldehyde group-containing compound, it is possible to remove the unreacted phenol derivative, aldehyde group-containing compound, water, and others by heating under reduced pressure. As for the condition, the temperature is preferably 80 to 180° C.; the pressure is preferably 100 mm Hg or less, more preferably 60 mm Hg or less; and the period is preferably 0.5 to 10 hours.

In the present invention, the compound (G) represented by the following Compositional Formula (XXXXIX) and/or the compound (H) represented by the following Compositional Formula (XXXXXIX) may be added as needed for improvement in the moisture resistance and high-temperature storage stability of semiconductor elements such as IC.

(Formula 40)

$$Mg_{1-x}Al_x(OH)_2(CO_3)_{x/2} \cdot mH_2O \qquad \text{(XXXXIX)}$$

(wherein, $0 < X \leq 0.5$, and m is a positive number).

(Formula 41)

$$BiO_x(OH)_y(NO_3)_z \qquad \text{(XXXXXIX)}$$

(wherein, $0.9 \leq x \leq 1.1$; $0.6 \leq y \leq 0.8$; and $0.2 \leq z \leq 0.4$)

Commercially available products of the compounds represented by Formula (XXXXIX) above include DHT-4A (trade name, manufactured by Kyowa Chemical Industry Co., Ltd.). Commercially available products of the compounds represented by Formula (XXXXXIX) include IXE500 (trade name, manufactured by Toagosei Co., Ltd.).

An other anion exchanger may also be added as needed. The anion exchanger is not particularly limited, and any one of known exchangers may be used. Examples thereof include hydrated metal oxides of an element selected from magnesium, aluminum, titanium, zirconium, and antimony, and the like, and these metal oxides may be used alone or in combination of two or more.

In addition, other additives, including a releasing agent such as higher fatty acid, higher fatty acid metal salt, ester-based wax, polyolefin wax, polyethylene, or oxidized polyethylene; a colorant such as carbon black; and a stress-relaxing agent such as silicone oil or silicone rubber powder, may be added as needed to the sealant epoxy-resin molding material according to the present invention.

The sealant epoxy-resin molding material according to the present invention is preferably used after previously melt-mixed with an epoxy resin (A) and a hardening agent (B) from the viewpoint of flame resistance. The melt-mixing method is not particularly limited, but they are preferably melted and mixed until becoming uniform, while heated at a temperature or more at which all or at least one of them melt. It is preferable to determine the optimal condition then for prevention of gelation, by studying the reactivity, for example, by GPC (gel-permeation chromatography) or FT-IR. When a compound represented by General Formula (I) above is used as the epoxy resin (A) and a compound represented by General Formula (II) above as the hardening agent (B), the resins are preferably melt-mixed at 80 to 120° C., more preferably 90 to 120° C., for 10 to 60 minutes, more preferably 20 to 40 minute.

The sealant epoxy-resin molding material according to the present invention may be prepared by any method, if various raw materials are dispersed and mixed uniformly thereby, and, in a general method, raw materials in blending amounts are mixed sufficiently, for example in a mixer, mixed or melt-kneaded, for example in a mixing roll, extruder, mortar and pestle machine, or planetary mixer, cooled, furthermore, degassed and pulverized as needed. The molding material may be tabletized into the size and weight suitable for the molding condition as needed.

A low-pressure transfer molding method is most commonly used as the method of producing electronic component devices such as semiconductor device by using the sealant epoxy-resin molding material according to the present invention as a sealer, but other method such as injection molding or compression molding may be used instead. Yet another method such as discharging, molding, or printing may be used.

The electronic component devices according to the present invention having an element sealed with the sealant epoxy-resin molding material according to the present invention include electronic component devices having an element, for example as an active element such as semiconductor chip, transistor, diode or thyristor or a passive element such as capacitor, resistor or coil, formed on a supporting material or mounting substrate such as lead frame, wired tape support, wiring board, glass, or silicon wafer, of which desirable regions are sealed with the sealant epoxy-resin molding material according to the present invention, and the like.

The substrate for mounting is not particularly limited, and examples thereof include organic substrates, organic films, ceramic substrates, interposer substrates such as of glass plate, glass plates for liquid crystal, MCM (Multi Chip Module) substrates, hybrid IC substrates, and the like.

Examples of the electronic component devices include semiconductor devices, and typical examples thereof include resin-sealed IC's prepared by mounting an element such as semiconductor chip on a lead frame (island, tab), connecting the terminal of the element such as bonding pad and lead areas by wire bonding or bumping, and then, sealing the element with the sealant epoxy-resin molding material according to the present invention for example by transfer molding, such as DIP (Dual Inline Package), PLCC (Plastic Leaded Chip Carrier), QFP (Quad Flat Package), SOP (Small Outline Package), SOJ (Small Outline J-lead Package), TSOP (Thin Small Outline Package), and TQFP (Thin Quad Flat Package); TCP's (Tape Carrier Packages) prepared by sealing a semiconductor chip lead-bonded to a tape support with the sealant epoxy-resin molding material according to the present invention; semiconductor devices mounted on bare chip, such as COB's (Chip On Board) and COG (Chip On Glass), prepared by sealing a semiconductor chip connected to a wiring formed on a wiring board or glass plate with the sealant epoxy-resin molding material according to the present invention, for example by wire bonding, flip-chip bonding, or soldering; hybrid IC's prepared by sealing an active element such as semiconductor chip, transistor, diode, or thyristor and/or a passive element such as capacitor, resistor, or coil connected to a wiring formed on a wiring board or glass with the sealant epoxy-resin molding material according to the present invention, for example by wire bonding, flip chip bonding, or solder; BGA's (Ball Grid Arrays), CSP's (Chip Size Packages), and MCP's (Multi Chip Packages) prepared by mounting a semiconductor chip on an interposer substrate having a terminal for connection to a MCM (Multi Chip Module) mother board, connecting the semiconductor chip to a wiring formed on the interposer substrate by bumping or wire bonding, and then, sealing the semiconductor chip-sided surface of the substrate with the sealant epoxy-resin molding material according to the present invention; and the like. The semiconductor device may be a stacked package in which two or more elements are mounted as stacked (laminated) on a mounting substrate, or a simultaneously molding package in which two or more elements are sealed simultaneously with a sealant epoxy-resin molding material. Among them, the present sealant epoxy-resin molding material is used favorably in BGA's, in particular simultaneously molding BGA's, because it shows high flame resistance and is superior in flowability even when the amount of the filler is not extremely much.

EXAMPLES

Hereinafter, the present invention will be described with reference to Examples, but it should be understood that the scope of the present invention is not limited to these Examples.

Examples 1 to 31 and Comparative Examples 1 to 14

Epoxy resins used below were an epoxy resin from the monomer represented by Formula (IV) having an epoxy equivalence of 180 and a melting point of 105° C. (trade name: EPIKOTE YL-7172, manufactured by Japan Epoxy Resin Co., Ltd. epoxy resin 1); a biphenylene-based epoxy resin having an epoxy equivalence of 273 and a softening point of 58° C. (trade name: NC-3000, manufactured by Nippon Kayaku Co., Ltd., epoxy resin 2); a biphenyl-based epoxy resin having an epoxy equivalence of 196 and a melting point of 106° C. (trade name: EPIKOTE YX-4000H, manufactured by Japan Epoxy Resin Co., Ltd., epoxy resin 3); a sulfur atom-containing epoxy resin having an epoxy equivalence of 245 and a melting point of 110° C. (trade name: YSLV-120TE, manufactured by Tohto Kasei Co., Ltd., epoxy resin 4); and an o-cresol novolak epoxy resin having an epoxy equivalence of 195 and a softening point of 65° C. (trade name: ESCN-190, manufactured by Sumitomo Chemical Co., Ltd., epoxy resin 5).

The hardening agents used were a phenol-aralkyl resin having a softening point of 70° C. and a hydroxyl group equivalence of 175 (trade name: Milex XLC-3L, manufactured by Mitsui Chemicals, Inc., hardening agent 1); a biphenylene-based phenol resin having a softening point of 80° C. and a hydroxyl group equivalence of 199 (trade name: MEH-7851, manufactured by Meiwa Plastic Industries, Ltd., hardening agent 2); a β-naphthol-aralkyl resin having a hydroxyl group equivalence 182 and a softening point of 67° C. (trade name: SN-170, manufactured by Nippon Steel Chemical Co., Ltd., hardening agent 3), an acenaphthylene-containing β-naphthol-aralkyl resin having a hydroxyl group equivalence of 199 and a softening point 78° C. (trade name: SN-170AR-10, manufactured by Nippon Steel Chemical Co., Ltd., hardening agent 4); and a phenolic novolak resin having a softening point of 80° C. and a hydroxyl group equivalence of 106 (trade name: H-1, manufactured by Meiwa Plastic Industries, Ltd., hardening agent 5).

The hardening accelerators used were triphenylphosphine (accelerator 1), an adduct of triphenylphosphine of 1,4-benzoquinone (accelerator 2), and 1,8-diazabicyclo[5.4.0]undecene-7 (accelerator 3).

The coupling agents used were γ-glycidoxypropyltrimethoxysilane (epoxysilane) and a secondary amino group-containing silane-coupling agent (γ-anilinopropyltrimethoxysilane (anilinosilane)); the flame retardants used were a condensed aromatic phosphoric ester (trade name: PX-200, manufactured by Daihachi Chemical Industry Co., Ltd.), triphenylphosphine oxide, cyclophosphazene (trade name: SPE-100, manufactured by Otsuka Chemical Co., Ltd.), a composite metal hydroxide (magnesium hydroxide and zinc hydroxide solid solution, trade name: ECOMAGZ-10, manufactured by Tateho Chemical Industries Co., Ltd.), zinc molybdenate (trade name: KEMGARD911B, manufactured by Sherwin-Williams), zinc borate (trade name: FRZ-500C, manufactured by Mizusawa Industrial Chemicals, Ltd.), antimony trioxide, and a bisphenol-A-based brominated epoxy resin having an epoxy equivalence of 397, a softening point of 69° C., and a bromine content of 49 wt % (tradename: YDB-400, manufactured by Tohto Kasei Co., Ltd.); and the inorganic filler used was spherical fused silica having an average diameter of 14.5 μm and a specific surface area of 2.8 m$^2$/g.

The other additives used were carnauba wax (manufactured by Clariant (Japan) K.K.), carbon black (trade name: MA-100, manufactured by Mitsubishi Chemical Corp.), a silicon-containing polymer (trade name: AY42-119, manufactured by Dow Corning Toray Silicone Co., Ltd.), the cocondensation polymer of phenolic hydroxyl group-containing compound/triazine derivative/aldehyde group-containing compound prepared in the Preparative Example below, hydrotalcite (trade name: DHT-4A, manufactured by Kyowa Chemical Industry Co., Ltd.), and bismuth compound (trade name: IXE500, manufactured by Toagosei Co., Ltd.).

These raw materials were blended in the compositions by mass respectively shown in Tables 1 to 6, roll-kneaded under the condition of a kneading temperature of 80° C. and a kneading period of 10 minutes, to give the compositions of Examples 1 to 31 and Comparative Examples 1 to 14. The melted resin 1 in Example 18 and the melamine-modified phenol resins in Examples 28 and 29 were prepared as follows:

<Preparation of Melted Resin 1>

150 g of YL-7172 (epoxy resin 1) above and 146 g of XLC-3L (hardening agent 1) above were placed in a 500-mL separable flask equipped with a stirring rod, a thermometer, a nitrogen-supplying tube and a condenser tube, and the mixture was blended under heat in an oil bath at 130° C. The mixture was stirred for 30 minutes after melting, and the melted resin was cooled in a vat, to give a melted resin 1.

<Preparation of Cocondensation Polymer of Phenolic Hydroxyl Group-Containing Compound/Triazine Derivative/Aldehyde Group-Containing Compound (Melamine-Modified Phenol Resin)>

94 g (1 mole) of phenol and 32.4 g (0.4 mole) of 37% formalin water were placed in a flask equipped with a stirrer, a reflux condenser and a thermometer; the mixture was adjusted to pH 2 with 10% oxalic acid; and the mixture was heated under reflux dehydration to 120° C. over 8 hours, and allowed to react additionally at 120° C. for 6 hours. Then, the unreacted phenol, unreacted formaldehyde and water were removed at 120° C. under a reduce pressure of 60 mm Hg, to give 21.7 g of a phenol resin. 8.0 g (0.064 mole) of melamine and 24.3 g (0.3 mole) of 37% formalin water were added thereto, and the mixture was allowed to react additionally at 100° C. for 8 hours, to give a cocondensation polymer. Then, the unreacted phenol, unreacted aldehyde and water were removed at 140° C. under a reduced pressure of 60 mm Hg. The amount of the purified cocondensation polymer was 35.6 g.

[Table 1]

TABLE 1

| Blended components | Examples | | | | | | | |
|---|---|---|---|---|---|---|---|---|
| | 1 | 2 | 3 | 4 | 5 | 6 | 7 | 8 |
| epoxy resin 1 | 100 | 100 | 100 | 100 | 100 | 100 | 100 | 100 |
| epoxy resin 2 | | | | | | | | |
| epoxy resin 3 | | | | | | | | |
| epoxy resin 4 | | | | | | | | |
| epoxy resin 5 | | | | | | | | |
| brominated epoxy resin | | | | | | | | |
| hardening agent 1 | 97 | 97 | 97 | 97 | 97 | 97 | 97 | 97 |
| hardening agent 2 | | | | | | | | |
| hardening agent 3 | | | | | | | | |

TABLE 1-continued

| Blended components | Examples | | | | | | | |
|---|---|---|---|---|---|---|---|---|
| | 1 | 2 | 3 | 4 | 5 | 6 | 7 | 8 |
| hardening agent 4 | | | | | | | | |
| hardening agent 5 | | | | | | | | |
| melted resin 1 | | | | | | | | |
| accelerator 1 | 2.0 | 2.0 | 2.0 | 2.0 | 2.0 | 2.0 | | |
| accelerator 2 | | | | | | | 2.5 | |
| accelerator 3 | | | | | | | | 2.0 |
| phosphoric ester | | | | | | | | |
| triphenyl phosphine oxide | | | | | | | | |
| cyclophosphazene | | | | | | | | |
| composite metal hydroxide | | | | | | | | |
| zinc molybdenate | | | | | | | | |
| zinc borate | | | | | | | | |
| antimony trioxide | | | | | | | | |
| epoxysilane | 1.0 | 1.0 | 1.0 | 1.0 | 1.0 | | 1.0 | 1.0 |
| anilinosilane | | | | | | 1.0 | | |
| carnauba wax | 2.0 | 2.0 | 2.0 | 2.0 | 2.0 | 2.0 | 2.0 | 2.0 |
| carbon black | 2.5 | 2.5 | 2.5 | 2.5 | 2.5 | 2.5 | 2.5 | 2.5 |
| fused silica | 302 | 470 | 1155 | 1754 | 3892 | 1155 | 1158 | 1155 |
| filler content (wt %) | 60 | 70 | 85 | 90 | 95 | 85 | 85 | 85 |

[Table 2]

TABLE 2

| Blended components | Examples | | | | | | | |
|---|---|---|---|---|---|---|---|---|
| | 9 | 10 | 11 | 12 | 13 | 14 | 15 | 16 |
| epoxy resin 1 | 100 | 100 | 100 | 100 | 50 | 20 | 50 | 50 |
| epoxy resin 2 | | | | | 50 | 70 | | |
| epoxy resin 3 | | | | | | | 50 | |
| epoxy resin 4 | | | | | | | | 50 |
| epoxy resin 5 | | | | | | | | |
| brominated epoxy resin | | | | | | | | |
| hardening agent 1 | | | | | 81 | 64 | 93 | 84 |
| hardening agent 2 | 111 | | | | | | | |
| hardening agent 3 | | 101 | | | | | | |
| hardening agent 4 | | | 111 | | | | | |
| hardening agent 5 | | | | 59 | | | | |
| melted resin 1 | | | | | | | | |
| accelerator 1 | 2.0 | 2.0 | 2.0 | 2.0 | 2.0 | 2.0 | 2.0 | 2.0 |
| accelerator 2 | | | | | | | | |
| accelerator 3 | | | | | | | | |
| phosphoric ester | | | | | | | | |
| triphenyl phosphine oxide | | | | | | | | |
| cyclophosphazene composite | | | | | | | | |
| metal hydroxide | | | | | | | | |
| zinc molybdenate | | | | | | | | |
| zinc borate | | | | | | | | |
| antimony trioxide | | | | | | | | |
| epoxysilane | 1.0 | 1.0 | 1.0 | 1.0 | 1.0 | 1.0 | 1.0 | 1.0 |
| anilinosilane | | | | | | | | |
| carnauba wax | 2.0 | 2.0 | 2.0 | 2.0 | 2.0 | 2.0 | 2.0 | 2.0 |
| carbon black | 2.5 | 2.5 | 2.5 | 2.5 | 2.5 | 2.5 | 2.5 | 2.5 |
| fused silica | 1230 | 1177 | 1230 | 939 | 1061 | 913 | 1132 | 1082 |
| filler content (wt %) | 85 | 85 | 85 | 85 | 85 | 85 | 85 | 85 |

[Table 3]

TABLE 3

| Blended components | Examples | | | | | | | |
|---|---|---|---|---|---|---|---|---|
| | 17 | 18 | 19 | 20 | 21 | 22 | 23 | 24 |
| epoxy resin 1 | 50 | | 100 | 100 | 100 | 100 | 100 | 100 |
| epoxy resin 2 | | | | | | | | |
| epoxy resin 3 | | | | | | | | |
| epoxy resin 4 | | | | | | | | |
| epoxy resin 5 | 50 | | | | | | | |
| brominated epoxy resin | | | | | | | | |
| hardening agent 1 | 93 | | 97 | 97 | 97 | 97 | 97 | 97 |
| hardening agent 2 | | | | | | | | |
| hardening agent 3 | | | | | | | | |
| hardening agent 4 | | | | | | | | |
| hardening agent 5 | | | | | | | | |
| melted resin 1 | | 197 | | | | | | |
| accelerator 1 | 2.0 | 2.0 | 2.0 | 2.0 | 2.0 | 2.0 | 2.0 | 2.0 |
| accelerator 2 | | | | | | | | |
| accelerator 3 | | | | | | | | |
| phosphoric ester | | | 10 | | | | | |
| triphenyl phosphine oxide | | | | 10 | | | | |
| cyclophosphazene composite | | | | | 10 | | | |
| metal hydroxide | | | | | | 50 | | |
| zinc molybdenate | | | | | | | 5 | |
| zinc borate | | | | | | | | 10 |
| antimony trioxide | | | | | | | | |
| epoxysilane | 1.0 | 1.0 | 1.0 | 1.0 | 1.0 | 1.0 | 1.0 | 1.0 |
| anilinosilane | | | | | | | | |
| carnauba wax | 2.0 | 2.0 | 2.0 | 2.0 | 2.0 | 2.0 | 2.0 | 2.0 |
| carbon black | 2.5 | 2.5 | 2.5 | 2.5 | 2.5 | 2.5 | 2.5 | 2.5 |
| fused silica | 1134 | 1154 | 317 | 317 | 317 | 257 | 302 | 302 |
| filler content (wt %) | 85 | 85 | 60 | 60 | 60 | 60 | 60 | 60 |

[Table 4]

TABLE 4

| Blended components | Comparative Examples | | | | | | | |
|---|---|---|---|---|---|---|---|---|
| | 1 | 2 | 3 | 4 | 5 | 6 | 7 | 8 |
| epoxy resin 1 | | | | | | | | |
| epoxy resin 2 | 100 | 100 | 100 | 100 | 100 | 100 | | |
| epoxy resin 3 | | | | | | | 100 | |
| epoxy resin 4 | | | | | | | | 100 |
| epoxy resin 5 | | | | | | | | |
| brominated epoxy resin | | | | | | | | |
| hardening agent 1 | | | | | | 64 | 89 | 71 |
| hardening agent 2 | 73 | 73 | 73 | 73 | 73 | | | |
| hardening agent 3 | | | | | | | | |
| hardening agent 4 | | | | | | | | |
| hardening agent 5 | | | | | | | | |
| melted resin 1 | | | | | | | | |
| accelerator 1 | 2.0 | 2.0 | 2.0 | 2.0 | 2.0 | 2.0 | 2.0 | 2.0 |
| accelerator 2 | | | | | | | | |
| accelerator 3 | | | | | | | | |
| phosphoric ester | | | | | | | | |
| triphenylphosphine oxide | | | | | | | | |
| cyclophosphazene composite | | | | | | | | |
| metal hydroxide | | | | | | | | |
| zinc molybdenate | | | | | | | | |
| zinc borate | | | | | | | | |
| antimony trioxide | | | | | | | | |
| epoxysilane | 1.0 | 1.0 | 1.0 | 1.0 | 1.0 | 1.0 | 1.0 | 1.0 |
| anilinosilane | | | | | | | | |
| carnauba wax | 2.0 | 2.0 | 2.0 | 2.0 | 2.0 | 2.0 | 2.0 | 2.0 |
| carbon black | 2.5 | 2.5 | 2.5 | 2.5 | 2.5 | 2.5 | 2.5 | 2.5 |

TABLE 4-continued

| Blended components | Comparative Examples | | | | | | | |
|---|---|---|---|---|---|---|---|---|
| | 1 | 2 | 3 | 4 | 5 | 6 | 7 | 8 |
| fused silica | 267 | 415 | 1018 | 1545 | 3430 | 968 | 1110 | 1009 |
| filler content (wt %) | 60 | 70 | 85 | 90 | 95 | 85 | 85 | 85 |

[Table 5]

TABLE 5

| Blended components | Comparative Examples | | | | | |
|---|---|---|---|---|---|---|
| | 9 | 10 | 11 | 12 | 13 | 14 |
| epoxy resin 1 | | | | | | |
| epoxy resin 2 | | | | | | |
| epoxy resin 3 | | 100 | 100 | 100 | 100 | 85 |
| epoxy resin 4 | | | | | | |
| epoxy resin 5 | 100 | | | | | |
| Brominated epoxy resin | | | | | | 15 |
| hardening agent 1 | 90 | 89 | 89 | 89 | 89 | 83 |
| hardening agent 2 | | | | | | |
| hardening agent 3 | | | | | | |
| hardening agent 4 | | | | | | |
| hardening agent 5 | | | | | | |
| melted resin 1 | | | | | | |
| accelerator 1 | 2.0 | 2.0 | 2.0 | 2.0 | 2.0 | 2.0 |
| accelerator 2 | | | | | | |
| accelerator 3 | | | | | | |
| phosphoric ester | | 30 | | | | |
| triphenyl phosphine oxide | | | 30 | | | |
| cyclophosphazene | | | | 30 | | |
| composite metal hydroxide | | | | | 100 | |
| zinc molybdenate | | | | | | |
| zinc borate | | | | | | |
| antimony trioxide | | | | | | 10 |
| epoxysilane | 1.0 | 1.0 | 1.0 | 1.0 | 1.0 | 1.0 |
| anilinosilane | | | | | | |
| carnauba wax | 2.0 | 2.0 | 2.0 | 2.0 | 2.0 | 2.0 |
| carbon black | 2.5 | 2.5 | 2.5 | 2.5 | 2.5 | 2.5 |
| fused silica | 1113 | 1279 | 1279 | 1279 | 992 | 1070 |
| filler content (wt %) | 85 | 85 | 85 | 85 | 85 | 85 |

[Table 6]

TABLE 6

| Blended components | Examples | | | | | | |
|---|---|---|---|---|---|---|---|
| | 25 | 26 | 27 | 28 | 29 | 30 | 31 |
| epoxy resin 1 | 100 | 100 | 100 | 100 | 100 | 100 | 100 |
| epoxy resin 2 | | | | | | | |
| epoxy resin 3 | | | | | | | |
| epoxy resin 4 | | | | | | | |
| epoxy resin 5 | | | | | | | |
| brominated epoxy resin | | | | | | | |
| hardening agent 1 | 97 | 97 | 97 | 82 | 82 | 97 | 97 |
| hardening agent 2 | | | | | | | |
| hardening agent 3 | | | | | | | |
| hardening agent 4 | | | | | | | |
| hardening agent 5 | | | | | | | |
| melted resin 1 | | | | | | | |
| accelerator 1 | 2.0 | 2.0 | 2.0 | 2.0 | 2.0 | 2.0 | 2.0 |
| accelerator 2 | | | | | | | |
| accelerator 3 | | | | | | | |
| phosphoric ester | | | | | | | |
| triphenyl phosphine oxide | | | | | | | |
| cyclophosphazene | | | | | | | |
| composite metal hydroxide | | | | | | | |
| zinc molybdenate | | | | | | | |
| zinc borate | | | | | | | |
| antimony trioxide | | | | | | | |
| hydrotalcite | | | | | | 3.0 | |
| bismuth compound | | | | | | | 3.0 |
| silicon-containing polymer | 10.0 | 20.0 | 30.0 | | 20.0 | | |
| melamine-modified phenol resin | | | | 10.0 | 10.0 | | |
| epoxysilane | 1.0 | 1.0 | 1.0 | 1.0 | 1.0 | 1.0 | 1.0 |
| anilinosilane | | | | | | | |
| carnauba wax | 2.0 | 2.0 | 2.0 | 2.0 | 2.0 | 2.0 | 2.0 |
| carbon black | 2.5 | 2.5 | 2.5 | 2.5 | 2.5 | 2.5 | 2.5 |

TABLE 6-continued

| | Examples | | | | | | |
|---|---|---|---|---|---|---|---|
| Blended components | 25 | 26 | 27 | 28 | 29 | 30 | 31 |
| fused silica | 1211 | 1268 | 1324 | 1125 | 1238 | 1155 | 1155 |
| filler content (wt %) | 85 | 85 | 85 | 85 | 85 | 85 | 85 |

Properties of the sealant epoxy-resin molding materials prepared in Examples 1 to 31 and Comparative Examples 1 to 14 were determined in the following tests. Results are summarized in Tables 7 to 12.

(1) Spiral Flow

The flow distance (cm) of each sealant epoxy-resin molding material was determined in a transfer-molding machine by molding it, by using a mold compatible with EMMI-1-66 for spiral flow measurement under the condition of a mold temperature of 180° C., a molding pressure of 6.9 MPa, and a hardening period of 90 seconds.

(2) Hardness When Hot

Each sealant epoxy-resin molding material was molded into a circular disk having a diameter of 50 mm and a thickness of 3 mm under the molding condition of (1), and immediately the hardness thereof was determined by using a Shore D hardness meter.

(3) Flame Resistance

Each sealant epoxy-resin molding material was molded under the molding condition of (1) by using a mold die for a sample having a thickness of 1/16 inch and hardened at 180° C. for 5 hours as a post cure, and the flame resistance thereof is determined according to the test method of UL-94.

(4) Reflow Resistance

An 80-pin flat package (QFP) having an external size of 20 mm×14 mm×2 mm (lead frame material: copper alloy, tip of the lead silver-plated) carrying a silicon chip of 8 mm×10 mm×0.4 mm in size was molded and post cured by using each sealant epoxy-resin molding material under the condition of (3), moistened under the condition of 85° C. and 85% RH, and subjected to reflow treatment at a particular time interval at 240° C. for 10 seconds; presence of cracks then was determined; and the reflow resistance was evaluated, based on the number of packages cracks generated on five test packages.

(5) Moisture Resistance

An 80-pin flat package (QFP) having an external dimension of 20 mm×14 mm×2.7 mm carrying a test silicon chip of 6 mm×6 mm×0.4 mm in size with aluminum wiring having a line width 10 μm and a thickness 1 μm on an oxide layer having thickness of 5 μm was molded and post cured by using each sealant epoxy-resin molding material under the condition of (3) and moistened after pretreatment; disconnection defects by aluminum wiring corrosion was analyzed at a particular time interval; and the moisture resistance thereof is evaluated, based on the number of defective packages on ten test packages.

In the pretreatment, the flat package was moistened under the condition of 85° C. and 85% RH for 72 hours and subjected to a vapor-phase reflow treatment at 215° C. for 90 seconds. Then, it is moistened under the condition of 0.2 MPa and 121° C.

(6) High-Temperature Storage Stability

A test silicon chip of 5 mm×9 mm×0.4 mm in size carrying aluminum wiring having a line width 10 μm and a thickness of 1 μm formed on the oxide layer having a thickness of 5 μm was mounted with silver paste on a 42-alloy lead frame partially silver-plated; a 16-pin DIP (Dual Inline Package), in which the bonding pad of the chip and the inner lead were connected to each other with Au wire at 200° C. with a thermosonic bonder, was prepared by molding with each sealant epoxy-resin molding material and post curing under the conditions of (3), and stored in a tank at a high temperature of 200° C.; the DIP was withdrawn from the tank at a particular time interval and subjected to a continuity test; and the high-temperature storage stability was evaluated by the number of continuity defective packages on ten test packages.

(7) Molding Shrinkage

A mold die for sample preparation giving a plate sample in a size of length 127 mm×thickness 6.4 mm×width 12.7 mm was heated to 180° C. After confirmation that the mold die was heated to 180° C., the length between right and left ends of a mold groove in the length direction was determined by using a vernier caliper to the order of 0.01 mm, and the result was recorded. A test piece was molded in the mold die under the molding condition of (1), separated immediately therefrom, and allowed to cool to room temperature in air. Then, the length between right and left ends of the test piece in the length direction was determined to the order of 0.01 mm with a vernier caliper, and the result was recorded; and the molding shrinkage was calculated according to the next Formula.

$$\text{Molding shrinkage (\%)}=100\times((D1-d1)/D1+(D2-d2)/D2)/2$$

(wherein, d1 and d2 represent the length (mm) between the right and left ends of test piece in the length direction; and D1 and D2 represent the length (mm) of the groove on the mold die corresponding to d1 and d2 when measured at 180° C.).

(8) Gold-Wire Flow

Preparation of Simultaneously Molded (MAP-Type) BGA 24 semiconductor chips having a chip size of 8.0 mm×8.0 mm×0.3 mm thickness (area: 64 mm$^2$) and a pad pitch of 80 μm that carry a die bond film (trade name: DF-400, manufactured by Hitachi Chemical Co., Ltd.) bonded on the rear face, were placed, four vertically and six horizontally, on an insulation base material of 60 mm (length)×90 mm (width)×0.4 mm (thickness) (glass cloth-epoxy resin laminated sheet, trade name: E-679, manufactured by Hitachi Chemical Co., Ltd.). They are bonded at a compression temperature of 200° C. and a load of 1.96N for a pressurization period of 10 seconds, baked at 180° C. for 1 hour, and wire-bonded with gold wire having a diameter of 30 μm and a length of 2 mm; and the semiconductor chip-carrying face was transfer-molded into the size of 53 mm (length)×83 mm (width)×0.8 mm (thickness) under the condition of (1) by using each sealant epoxy-resin molding material, to give a semiconductor device (simultaneously molded (MAP-type) BGA) having a package thickness of 1.2 mm.

Measurement of Gold-Wire Flow

Deformation of the wire on the semiconductor device was observed radioscopically by using a soft X-ray analyzer (PRO-TEST100, manufactured by Softex Corp.) under the condition of a voltage of 100 kV and a current of 1.5 mA, as an indicator of the wire flow. The deformation was observed in the direction perpendicular to the chip face; the minimal distance L of wire bonding and the maximum displacement value X of the wire were determined; and the wire deformation (%) was calculated by the Formula: X/L×100.

(9) Warping

An MAP-type BGA similar to that prepared in (8) above was molded under the condition of (3) by using each sealant epoxy-resin molding material; and the warping thereof was evaluated by measuring the difference in displacement (mm) between the package terminal and the maximum deformation region, by using a non-contact profilometer (YP10-10G1(J1), manufactured by Sony Precision Technology Co., Ltd.).

[Table 7]

TABLE 7

| Properties | | Examples | | | | | | | |
|---|---|---|---|---|---|---|---|---|---|
| | | 1 | 2 | 3 | 4 | 5 | 6 | 7 | 8 |
| Flame resistance | | | | | | | | | |
| Total flame remain time (s) | | 38 | 18 | 7 | 15 | 29 | 5 | 8 | 16 |
| Judgment | | V-0 | V-0 | V-0 | V-0 | V-0 | V-0 | V-0 | V-0 |
| Spiral flow (cm) | | 168 | 142 | 130 | 118 | 95 | 138 | 135 | 124 |
| Hardness when hot (Shore D) | | 61 | 68 | 72 | 75 | 79 | 76 | 74 | 63 |
| Reflow resistance | 48 h | 0/5 | 0/5 | 0/5 | 0/5 | 0/5 | 0/5 | 0/5 | 0/5 |
| | 72 h | 5/5 | 0/5 | 0/5 | 0/5 | 0/5 | 0/5 | 0/5 | 0/5 |
| | 96 h | 5/5 | 3/5 | 0/5 | 0/5 | 0/5 | 1/5 | 0/5 | 2/5 |
| | 168 h | 5/5 | 5/5 | 3/5 | 1/5 | 0/5 | 5/5 | 2/5 | 5/5 |
| Moisture resistance | 100 h | 0/10 | 0/10 | 0/10 | 0/10 | 0/10 | 0/10 | 0/10 | 0/10 |
| | 500 h | 0/10 | 0/10 | 0/10 | 0/10 | 0/10 | 0/10 | 0/10 | 0/10 |
| | 1000 h | 0/10 | 0/10 | 0/10 | 0/10 | 0/10 | 0/10 | 0/10 | 0/10 |
| | 1500 h | 0/10 | 0/10 | 0/10 | 0/10 | 0/10 | 0/10 | 0/10 | 0/10 |
| | 2000 h | 2/10 | 2/10 | 1/10 | 0/10 | 0/10 | 4/10 | 0/10 | 5/10 |
| | 3000 h | 8/10 | 5/10 | 5/10 | 5/10 | 4/10 | 8/10 | 4/10 | 10/10 |
| High-temperature storage stability | 500 h | 0/10 | 0/10 | 0/10 | 0/10 | 0/10 | 0/10 | 0/10 | 0/10 |
| | 1000 h | 0/10 | 0/10 | 0/10 | 0/10 | 0/10 | 0/10 | 0/10 | 0/10 |
| | 1500 h | 0/10 | 0/10 | 0/10 | 0/10 | 0/10 | 0/10 | 0/10 | 0/10 |
| | 2000 h | 0/10 | 0/10 | 0/10 | 0/10 | 0/10 | 0/10 | 0/10 | 0/10 |
| Molding shrinkage (%) | | — | — | 0.3 | 0.2 | 0.1 | 0.3 | 0.3 | 0.4 |
| Gold-wire flow (%) | | — | — | 1.5 | 2.1 | 2.7 | 1.2 | 1.0 | 1.8 |
| Warping (mm) | | — | — | 0.3 | 0.2 | 0.1 | 0.2 | 0.2 | 0.4 |

[Table 8]

TABLE 8

| Properties | | Examples | | | | | | | |
|---|---|---|---|---|---|---|---|---|---|
| | | 9 | 10 | 11 | 12 | 13 | 14 | 15 | 16 |
| Flame resistance | | | | | | | | | |
| Total flame remain time (s) | | 44 | 25 | 14 | 48 | 28 | 46 | 35 | 43 |
| Judgment | | V-0 | V-0 | V-0 | V-0 | V-0 | V-0 | V-0 | V-0 |
| Spiral flow (cm) | | 141 | 116 | 110 | 97 | 112 | 99 | 131 | 132 |
| Hardness when hot (Shore D) | | 63 | 75 | 74 | 81 | 75 | 78 | 70 | 68 |
| Reflow resistance | 48 h | 0/5 | 0/5 | 0/5 | 0/5 | 0/5 | 0/5 | 0/5 | 0/5 |
| | 72 h | 0/5 | 0/5 | 0/5 | 5/5 | 0/5 | 0/5 | 0/5 | 0/5 |
| | 96 h | 0/5 | 0/5 | 0/5 | 5/5 | 2/5 | 5/5 | 0/5 | 0/5 |
| | 168 h | 5/5 | 5/5 | 5/5 | 5/5 | 5/5 | 5/5 | 5/5 | 0/5 |
| Moisture resistance | 100 h | 0/10 | 0/10 | 0/10 | 0/10 | 0/10 | 0/10 | 0/10 | 0/10 |
| | 500 h | 0/10 | 0/10 | 0/10 | 0/10 | 0/10 | 0/10 | 0/10 | 0/10 |
| | 1000 h | 0/10 | 0/10 | 0/10 | 0/10 | 0/10 | 0/10 | 0/10 | |
| | 1500 h | 0/10 | 0/10 | 0/10 | 0/10 | 0/10 | 0/10 | 0/10 | |

TABLE 8-continued

|  | | Examples | | | | | | | |
|---|---|---|---|---|---|---|---|---|---|
| Properties | | 9 | 10 | 11 | 12 | 13 | 14 | 15 | 16 |
| | 2000 h | 3/10 | 2/10 | 2/10 | 1/10 | 1/10 | 1/10 | 1/10 | 2/10 |
| | 3000 h | 7/10 | 3/10 | 4/10 | 4/10 | 7/10 | 5/10 | 6/10 | 7/10 |
| High-temperature | 500 h | 0/10 | 0/10 | 0/10 | 0/10 | 0/10 | 0/10 | 0/10 | 0/10 |
| storage | 1000 h | 0/10 | 0/10 | 0/10 | 0/10 | 0/10 | 0/10 | 0/10 | 0/10 |
| stability | 1500 h | 0/10 | 0/10 | 0/10 | 0/10 | 0/10 | 0/10 | 0/10 | 0/10 |
| | 2000 h | 0/10 | 0/10 | 0/10 | 0/10 | 0/10 | 0/10 | 0/10 | 0/10 |
| Molding shrinkage (%) | | 0.5 | 0.4 | 0.3 | 0.3 | 0.4 | 0.7 | 0.5 | 0.5 |
| Gold-wire flow (%) | | 1.4 | 1.7 | 1.8 | 2.5 | 1.9 | 2.8 | 1.6 | 1.7 |
| Warping (mm) | | 0.4 | 0.4 | 0.4 | 0.3 | 0.5 | 0.6 | 0.4 | 0.4 |

[Table 9]

TABLE 9

|  | | Examples | | | | | | | |
|---|---|---|---|---|---|---|---|---|---|
| Properties | | 17 | 18 | 19 | 20 | 21 | 22 | 23 | 24 |
| Flame resistance | | | | | | | | | |
| Total flame remain time (s) | | 50 | 5 | 12 | 15 | 20 | 14 | 33 | 30 |
| Judgment | | V-0 | V-0 | V-0 | V-0 | V-0 | V-0 | V-0 | V-0 |
| Spiral flow (cm) | | 95 | 125 | 180 | 176 | 181 | 103 | 122 | 111 |
| Hardness when hot (Shore D) | | 80 | 75 | 58 | 60 | 55 | 74 | 73 | 70 |
| Reflow | 48 h | 0/5 | 0/5 | 0/5 | 0/5 | 0/5 | 0/5 | 0/5 | 0/5 |
| Resistance | 72 h | 3/5 | 0/5 | 3/5 | 4/5 | 3/5 | 0/5 | 0/5 | 0/5 |
| | 96 h | 5/5 | 0/5 | 5/5 | 5/5 | 5/5 | 2/5 | 0/5 | 5/5 |
| | 168 h | 5/5 | 5/5 | 5/5 | 5/5 | 5/5 | 5/5 | 5/5 | 5/5 |
| Moisture | 100 h | 0/10 | 0/10 | 0/10 | 0/10 | 0/10 | 0/10 | 0/10 | 0/10 |
| resistance | 500 h | 0/10 | 0/10 | 0/10 | 0/10 | 2/10 | 0/10 | 0/10 | 0/10 |
| | 1000 h | 0/10 | 0/10 | 2/10 | 0/10 | 5/10 | 0/10 | 0/10 | 0/10 |
| | 1500 h | 0/10 | 0/10 | 7/10 | 5/10 | 8/10 | 0/10 | 0/10 | 0/10 |
| | 2000 h | 1/10 | 1/10 | 8/10 | 7/10 | 8/10 | 0/10 | 2/10 | 3/10 |
| | 3000 h | 3/10 | 4/10 | 10/10 | 10/10 | 9/10 | 3/10 | 7/10 | 9/10 |
| High-temperature | 500 h | 0/10 | 0/10 | 0/10 | 0/10 | 0/10 | 0/10 | 0/10 | 0/10 |
| storage | 1000 h | 0/10 | 0/10 | 0/10 | 0/10 | 0/10 | 0/10 | 0/10 | 0/10 |
| stability | 1500 h | 0/10 | 0/10 | 0/10 | 0/10 | 1/10 | 0/10 | 0/10 | 0/10 |
| | 2000 h | 0/10 | 0/10 | 3/10 | 2/10 | 3/10 | 0/10 | 0/10 | 0/10 |
| Molding shrinkage (%) | | 0.4 | 0.3 | — | — | — | — | — | — |
| Gold-wire flow (%) | | 3.0 | 1.2 | — | — | — | — | — | — |
| Warping (mm) | | 0.5 | 0.3 | — | — | — | — | — | — |

[Table 10]

TABLE 10

|  | | Comparative Examples | | | | | | | |
|---|---|---|---|---|---|---|---|---|---|
| Properties | | 1 | 2 | 3 | 4 | 5 | 6 | 7 | 8 |
| Flame resistance | | | | | | | | | |
| Total flame remain time (s) | | 127 | 76 | 55 | 51 | 52 | 68 | 155 | 173 |
| Judgment | | non-standard | V-1 | V-1 | V-1 | V-1 | V-1 | non-standard | non-standard |
| Spiral flow (cm) | | 133 | 114 | 104 | 94 | 76 | 99 | 133 | 135 |
| Hardness when hot (Shore D) | | 65 | 70 | 75 | 80 | 82 | 79 | 73 | 70 |
| Reflow | 48 h | 2/5 | 0/5 | 0/5 | 0/5 | 0/5 | 0/5 | 0/5 | 0/5 |
| Resistance | 72 h | 5/5 | 2/5 | 0/5 | 0/5 | 0/5 | 0/5 | 0/5 | 0/5 |
| | 96 h | 5/5 | 5/5 | 1/5 | 0/5 | 0/5 | 5/5 | 0/5 | 0/5 |
| | 168 h | 5/5 | 5/5 | 5/5 | 5/5 | 0/5 | 5/5 | 5/5 | 0/5 |

TABLE 10-continued

|  |  | Comparative Examples | | | | | | | |
|---|---|---|---|---|---|---|---|---|---|
| Properties | | 1 | 2 | 3 | 4 | 5 | 6 | 7 | 8 |
| Moisture resistance | 100 h | 0/10 | 0/10 | 0/10 | 0/10 | 0/10 | 0/10 | 0/10 | 0/10 |
| | 500 h | 0/10 | 0/10 | 0/10 | 0/10 | 0/10 | 0/10 | 0/10 | 0/10 |
| | 1000 h | 0/10 | 0/10 | 0/10 | 0/10 | 0/10 | 0/10 | 0/10 | 0/10 |
| | 1500 h | 0/10 | 0/10 | 0/10 | 0/10 | 0/10 | 0/10 | 0/10 | 0/10 |
| | 2000 h | 1/10 | 2/10 | 1/10 | 0/10 | 0/10 | 1/10 | 2/10 | 2/10 |
| | 3000 h | 8/10 | 4/10 | 3/10 | 5/10 | 3/10 | 3/10 | 7/10 | 8/10 |
| High-temperature storage Stability | 500 h | 0/10 | 0/10 | 0/10 | 0/10 | 0/10 | 0/10 | 0/10 | 0/10 |
| | 1000 h | 0/10 | 0/10 | 0/10 | 0/10 | 0/10 | 0/10 | 0/10 | 0/10 |
| | 1500 h | 0/10 | 0/10 | 0/10 | 0/10 | 0/10 | 0/10 | 0/10 | 0/10 |
| | 2000 h | 0/10 | 0/10 | 0/10 | 0/10 | 0/10 | 0/10 | 0/10 | 0/10 |
| Molding shrinkage (%) | | — | — | 0.5 | — | — | 0.4 | 0.6 | 0.7 |
| Gold-wire flow (%) | | — | — | 4.1 | — | — | 4.5 | 2.0 | 2.2 |
| Warping (mm) | | — | — | 0.6 | — | — | 0.6 | 0.7 | 0.8 |

[Table 11]

TABLE 11

|  |  | Comparative Examples | | | | | |
|---|---|---|---|---|---|---|---|
| Properties | | 9 | 10 | 11 | 12 | 13 | 14 |
| Flame resistance | | | | | | | |
| Total flame remain time (s) | | clamp | 37 | 30 | 40 | 22 | 5 |
| Judgment | | non-standard | V-0 | V-0 | V-0 | V-0 | V-0 |
| Spiral flow (cm) | | 82 | 182 | 173 | 181 | 73 | 128 |
| Hardness when hot (Shore D) | | 85 | 59 | 61 | 54 | 70 | 73 |
| Reflow resistance | 48 h | 5/5 | 0/5 | 0/5 | 0/5 | 0/5 | 0/5 |
| | 72 h | 5/5 | 4/5 | 5/5 | 5/5 | 1/5 | 0/5 |
| | 96 h | 5/5 | 5/5 | 5/5 | 5/5 | 2/5 | 0/5 |
| | 168 h | 5/5 | 5/5 | 5/5 | 5/5 | 5/5 | 2/5 |
| Moisture resistance | 100 h | 0/10 | 0/10 | 0/10 | 0/10 | 0/10 | 0/10 |
| | 500 h | 0/10 | 0/10 | 0/10 | 4/10 | 0/10 | 0/10 |
| | 1000 h | 0/10 | 5/10 | 2/10 | 8/10 | 0/10 | 0/10 |
| | 1500 h | 0/10 | 10/10 | 7/10 | 10/10 | 0/10 | 0/10 |
| | 2000 h | 1/10 | 10/10 | 8/10 | 10/10 | 0/10 | 1/10 |
| | 3000 h | 2/10 | 10/10 | 9/10 | 10/10 | 5/10 | 3/10 |
| High-temperature storage stability | 500 h | 0/10 | 0/10 | 0/10 | 0/10 | 0/10 | 3/10 |
| | 1000 h | 0/10 | 0/10 | 0/10 | 0/10 | 0/10 | 10/10 |
| | 1500 h | 0/10 | 0/10 | 0/10 | 3/10 | 0/10 | 10/10 |
| | 2000 h | 0/10 | 5/10 | 5/10 | 7/10 | 0/10 | 10/10 |
| Molding shrinkage (%) | | 0.4 | 0.8 | 0.7 | 0.9 | 1.1 | 0.7 |
| Gold-wire flow (%) | | 5.6 | 2.3 | 2.7 | 2.8 | 6.7 | 2.5 |
| Warping (mm) | | 0.6 | 1.2 | 1.1 | 1.2 | 2.3 | 0.7 |

[Table 12]

TABLE 12

|  |  | Examples | | | | | | |
|---|---|---|---|---|---|---|---|---|
| Properties | | 25 | 26 | 27 | 28 | 29 | 30 | 31 |
| Flame resistance | | | | | | | | |
| Total flame remain time (s) | | 7 | 10 | 11 | 5 | 6 | 6 | 6 |
| Judgment | | V-0 | V-0 | V-0 | V-0 | V-0 | V-0 | V-0 |
| Spiral flow (cm) | | 135 | 141 | 148 | 126 | 131 | 131 | 131 |
| Hardness when hot (Shore D) | | 72 | 70 | 68 | 75 | 73 | 73 | 73 |
| Reflow resistance | 48 h | 0/5 | 0/5 | 0/5 | 0/5 | 0/5 | 0/5 | 0/5 |
| | 72 h | 0/5 | 0/5 | 0/5 | 0/5 | 0/5 | 0/5 | 0/5 |

TABLE 12-continued

| Properties | | 25 | 26 | 27 | 28 | 29 | 30 | 31 |
|---|---|---|---|---|---|---|---|---|
| | 96 h | 0/5 | 0/5 | 0/5 | 0/5 | 0/5 | 0/5 | 0/5 |
| | 168 h | 3/5 | 3/5 | 5/5 | 1/5 | 0/5 | 0/5 | 0/5 |
| Moisture | 100 h | 0/10 | 0/10 | 0/10 | 0/10 | 0/10 | 0/10 | 0/10 |
| resistance | 500 h | 0/10 | 0/10 | 0/10 | 0/10 | 0/10 | 0/10 | 0/10 |
| | 1000 h | 0/10 | 0/10 | 0/10 | 0/10 | 0/10 | 0/10 | 0/10 |
| | 1500 h | 0/10 | 0/10 | 0/10 | 0/10 | 0/10 | 0/10 | 0/10 |
| | 2000 h | 1/10 | 2/10 | 2/10 | 3/10 | 5/10 | 0/10 | 0/10 |
| | 3000 h | 6/10 | 5/10 | 7/10 | 10/10 | 10/10 | 0/10 | 0/10 |
| High-temperature | 500 h | 0/10 | 0/10 | 0/10 | 0/10 | 0/10 | 0/10 | 0/10 |
| storage | 1000 h | 0/10 | 0/10 | 0/10 | 0/10 | 0/10 | 0/10 | 0/10 |
| stability | 1500 h | 0/10 | 0/10 | 0/10 | 0/10 | 0/10 | 0/10 | 0/10 |
| | 2000 h | 0/10 | 0/10 | 0/10 | 0/10 | 0/10 | 0/10 | 0/10 |
| Molding shrinkage (%) | | 0.2 | 0.1 | 0.1 | 0.3 | 0.2 | 0.3 | 0.3 |
| Gold-wire flow (%) | | 1.4 | 1.4 | 1.5 | 1.6 | 1.5 | 1.7 | 1.6 |
| Warping (mm) | | 0.2 | 0.1 | 0.0 | 0.3 | 0.1 | 0.3 | 0.3 |

The samples obtained in Comparative Examples 1 to 9, which contained no epoxy resin represented by the General Formula (I) according to the present invention and no flame retardant, were all inferior in flame resistance, and could not satisfy the requirements of UL-94 V-0.

Among the samples obtained in Comparative Examples 10 to 14, which contained no epoxy resin represented by the General Formula (I) but contains various flame retardants, the samples in Comparative Examples 10 to 12 were inferior in moisture resistance. Alternatively, the sample of Comparative Example 13 was inferior in flowability and also in gold wire flow. Yet alternatively, the sample obtained in Comparative Example 14 satisfied the requirements of V-0, but was inferior in high-temperature storage stability.

In contrast, all of the samples obtained in Examples 1 to 31, which contained the epoxy resin represented by the General Formula (I), satisfied the requirements of UL-94 V-0, and was superior in flame resistance and also in moldability. In addition, the samples obtained in Examples 2 to 11, 13 to 16, 18 and 22 to 31 were superior in reflow resistance, and the samples of Examples 1 to 20 and 22 to 31 were superior in reliability, specifically in moisture resistance and high temperature storage stability. Further, the samples obtained in Examples 25 to 27 and 29 were superior in molding-shrinkage resistance and resistant to warping, and the samples of Examples 30 and 31 were particularly superior in moisture resistance.

INDUSTRIAL APPLICABILITY

The sealant epoxy-resin molding material according to the present invention provides products such as electronic component devices superior in flame resistance, and is thus, very valuable in industrial applications.

The invention claimed is:

1. A sealant epoxy-resin molding material, comprising an epoxy resin (A) and a hardening agent (B), wherein the epoxy resin (A) contains a compound represented by the following General Formula (I):

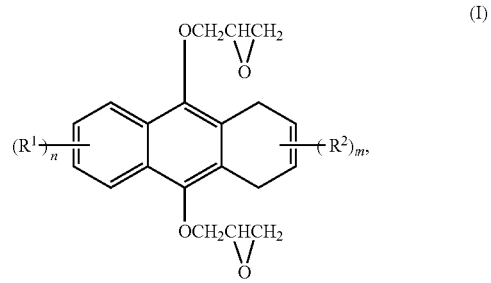

wherein in General formula (I), $R^1$ represents a group selected from substituted or unsubstituted hydrocarbon groups having 1 to 12 carbon atoms and substituted or unsubstituted alkoxyl groups having 1 to 12 carbon atoms, and the groups $R^1$ may be the same as or different from each other;

n is an integer of 0 to 4;

$R^2$ represents a group selected from substituted or unsubstituted hydrocarbon groups having 1 to 12 carbon atoms and substituted or unsubstituted alkoxy groups having 1 to 12 carbon atoms, and the groups $R^2$ may be the same as or different from each other; and m is an integer of 0 to 6.

2. The sealant epoxy-resin molding material according to claim 1, wherein the hardening agent (B) contains a compound represented by the following General Formula (II):

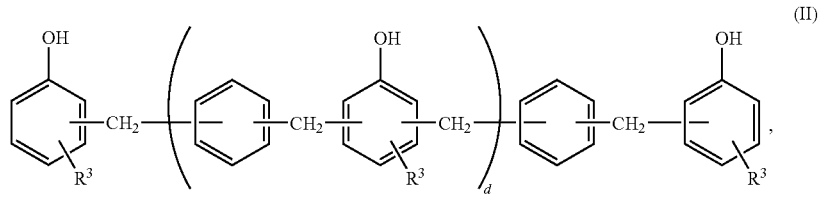

wherein R³ represents a group selected from a hydrogen atom and substituted or unsubstituted monovalent hydrocarbon groups having 1 to 10 carbon atoms; and d is an integer of 0 to 10.

3. The sealant epoxy-resin molding material according to claim 1, further comprising a hardening accelerator (C).

4. The sealant epoxy-resin molding material according to claim 3, wherein the hardening accelerator (C) is triphenylphosphine.

5. The sealant epoxy-resin molding material according to claim 3, wherein the hardening accelerator (C) is an adduct of a tertiary phosphine compound and a quinone compound.

6. The sealant epoxy-resin molding material according to claim 1, further comprising an inorganic filler (D).

7. The sealant epoxy-resin molding material according to claim 6, wherein the content of the inorganic filler (D) is 60 to 95 wt % with respect to the sealant epoxy-resin molding material.

8. The sealant epoxy-resin molding material according to claim 6, wherein the content of the inorganic filler (D) is 70 to 90 wt % with respect to the sealant epoxy-resin molding material.

9. The sealant epoxy-resin molding material according to claim 1, further comprising a coupling agent (E).

10. The sealant epoxy-resin molding material according to claim 9, wherein the coupling agent (E) contains a secondary amino group-containing silane-coupling agent.

11. The sealant epoxy-resin molding material according to claim 10, wherein the secondary amino group-containing silane-coupling agent contains a compound represented by the following General Formula (III):

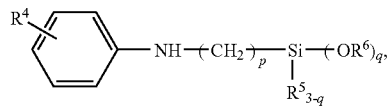

(III)

wherein R⁴ represents a group selected from a hydrogen atom, alkyl groups having 1 to 6 carbon atoms, and alkoxy group having 1 to 2 carbon atoms;

R⁵ represents a group selected from alkyl groups having 1 to 6 carbon atoms and a phenyl group;

R⁶ represents a methyl or ethyl group;

p is an integer of 1 to 6; and q is an integer of 1 to 3.

12. The sealant epoxy-resin molding material according to claim 1, wherein the epoxy resin (A) and the hardening agent (B) are melt-mixed previously.

13. A sealant epoxy-resin molding material, comprising:

an epoxy resin (A);

a hardening agent (B); and a silicon-containing polymer (F), wherein the silicon-containing polymer (F) has the following bonds (c) and (d),

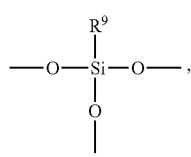

(c)

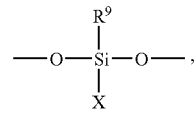

(d)

a terminal selected from R⁷, a hydroxyl group and alkoxy groups, and an epoxy equivalence of 500 to 4,000, wherein R⁷ represents a group selected from substituted or unsubstituted monovalent hydrocarbon groups having 1 to 12 carbon atoms; the groups R⁷ in the silicon-containing polymer may be the same as or different from each other; and X represents an epoxy group-containing monovalent organic group;

wherein the epoxy resin (A) contains a compound represented by the following General Formula (I),

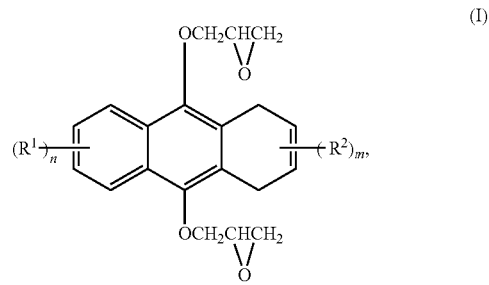

(I)

wherein in General formula (I), R¹ represents a group selected from substituted or unsubstituted hydrocarbon groups having 1 to 12 carbon atoms and substituted or unsubstituted alkoxyl groups having 1 to 12 carbon atoms, and the groups R¹ may be the same as or different from each other;

n is an integer of 0 to 4;

R² represents a group selected from substituted or unsubstituted hydrocarbon groups having 1 to 12 carbon atoms and substituted or unsubstituted alkoxy groups having 1 to 12 carbon atoms, and the groups R² may be the same as or different from each other; and m is an integer of 0 to 6.

14. The sealant epoxy-resin molding material according to claim 13, wherein the silicon-containing polymer (F) has the following bond (e) additionally:

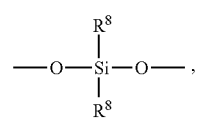

(e)

wherein R⁸ represents a group selected from substituted or unsubstituted monovalent hydrocarbon groups having 1 to 12 carbon atoms; and the groups R⁸ in the silicon-containing polymer may be the same as or different from each other.

15. The sealant epoxy-resin molding material according to claim 13, wherein the softening temperature of the silicon-containing polymer (F) is 40° C. or higher and 120° C. or lower.

16. The sealant epoxy-resin molding material according to claim 13, wherein R⁷ in the silicon-containing polymer (F) is at least one of a substituted or unsubstituted phenyl group and a substituted or unsubstituted methyl group.

17. The sealant epoxy-resin molding material according to claim 13, wherein the rate of substituted or unsubstituted phenyl groups having 1 to 12 carbon atoms in all groups $R^7$ in the silicon-containing polymer (F) is 60 to 100 mol %.

18. The sealant epoxy-resin molding material according to claim 1, further comprising at least one of a compound (G) represented by Compositional Formula (XXXXIX) and a compound (H) represented by the following Compositional Formula (XXXXXIX):

$$Mg_{1-a}Al_a(OH)_2(CO_3)_{a/2} \cdot kH_2O \qquad \text{(XXXXIX)},$$

wherein $0 < a \leqq 0.5$; and
k is a positive number), and $$BiO_b(OH)_y(NO_3)_z \qquad \text{(XXXXXIX)},$$

wherein $0.9 \leqq b \leqq 1.1$, $0.6 \leqq y \leqq 0.8$, and $0.2 \leqq z \leqq 0.4$.

19. An electronic component device, comprising an element sealed with the sealant epoxy-resin molding material according to claim 13.

20. The sealant epoxy-resin molding material according to claim 6, further comprising a coupling agent (E).

21. The sealant epoxy-resin molding material according to claim 20, further comprising a silicon-containing polymer (F) having the following bonds (c) and (d),

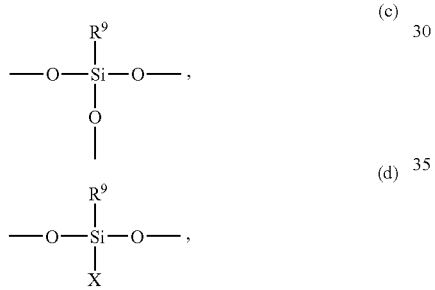

a terminal selected from $R^1$, a hydroxyl group and alkoxy groups, and an epoxy equivalence of 500 to 4,000,
wherein $R^9$ represents a group selected from substituted or unsubstituted monovalent hydrocarbon groups having 1 to 12 carbon atoms;
the groups $R^9$ in the silicon-containing polymer may be the same as or different from each other; and
X represents an epoxy group-containing monovalent organic group.

22. The sealant epoxy-resin molding material according to claim 3, further comprising an inorganic filler (D).

23. The sealant epoxy-resin molding material according to claim 3, further comprising a coupling agent (E).

24. The sealant epoxy-resin molding material according to claim 3, wherein the epoxy resin (A) and the hardening agent (B) are melt-mixed previously.

25. The sealant epoxy-resin molding material according to claim 3, further comprising a silicon-containing polymer (F) having the following bonds (c) and (d),

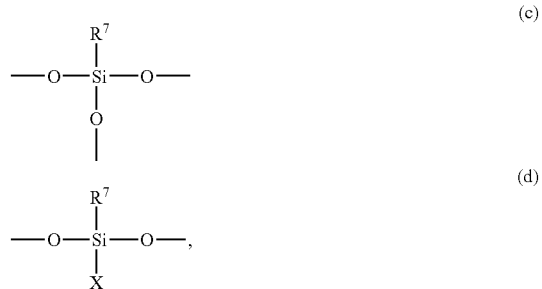

a terminal selected from $R^7$, a hydroxyl group and alkoxy groups, and an epoxy equivalence of 500 to 4,000,
wherein $R^7$ represents a group selected from substituted or unsubstituted monovalent hydrocarbon groups having 1 to 12 carbon atoms;
the groups $R^7$ in the silicon-containing polymer may be the same as or different from each other; and
X represents an epoxy group-containing monovalent organic group.

26. The sealant epoxy-resin molding material according to claim 3, further comprising at least one of a compound (G) represented by Compositional Formula (XXXXIX) and a compound (H) represented by the following Compositional Formula (XXXXXIX):

$$Mg_{1-a}Al_a(OH)_2(CO_3)_{a/2} \cdot kH_2O \qquad \text{(XXXXIX)},$$

wherein $0 < a \leqq 0.5$; and
m is a positive number), and $$BiO_b(OH)_y(NO_3)_z \qquad \text{(XXXXXIX)},$$

wherein $0.9 \leqq b \leqq 1.1$, $0.6 \leqq y \leqq 0.8$, and $0.2 \leqq z \leqq 0.4$.

* * * * *